(12) United States Patent
Wang et al.

(10) Patent No.: US 11,949,900 B2
(45) Date of Patent: Apr. 2, 2024

(54) SUB-BITSTREAM EXTRACTION

(71) Applicants: Beijing Bytedance Network Technology Co., Ltd., Beijing (CN); Bytedance Inc., Los Angeles, CA (US)

(72) Inventors: Ye-Kui Wang, San Diego, CA (US); Zhipin Deng, Beijing (CN)

(73) Assignees: BEIJING BYTEDANCE NETWORK TECHNOLOY CO., LTD., Beijing (CN); BYTEDANCE INC., Los Angeles, CA (US)

( * ) Notice: Subject to any disclaimer, the term of this patent is extended or adjusted under 35 U.S.C. 154(b) by 0 days.

(21) Appl. No.: 18/190,571

(22) Filed: Mar. 27, 2023

(65) Prior Publication Data
US 2023/0232029 A1  Jul. 20, 2023

Related U.S. Application Data

(63) Continuation of application No. PCT/CN2021/120531, filed on Sep. 26, 2021.

(30) Foreign Application Priority Data

Sep. 25, 2020  (WO) ................ PCT/CN2020/117596

(51) Int. Cl.
*H04N 19/31* (2014.01)
*C09K 13/06* (2006.01)
(Continued)

(52) U.S. Cl.
CPC ............ *H04N 19/46* (2014.11); *C09K 13/06* (2013.01); *C23F 1/26* (2013.01); *C23F 1/28* (2013.01);
(Continued)

(58) Field of Classification Search
CPC ....... H04N 19/46; H04N 19/188; H01N 49/31
See application file for complete search history.

(56) References Cited

U.S. PATENT DOCUMENTS 10,063,867 B2   8/2018  Wang
2015/0264404 A1  9/2015  Hannuksela
(Continued)

FOREIGN PATENT DOCUMENTS

| CN | 106464922 A | 2/2017 |
| EP | 2123049 B1 | 12/2016 |
| WO | 2018160976 A2 | 9/2018 |

OTHER PUBLICATIONS

Wang et al. "AHG9/AHG8/AHG12: On the subpicture sub-bitstream extraction process", Joint Video Experts Team (JVET) of ITU-T SG 16 WP3 and ISO/IEC JTC 1/SC 29/WG 11 19th Meeting, JVET-20154-v1, Jul. 1, 2020 (Jul. 1, 2020) (hereinafter Wang (Year: 2020).*

(Continued)

*Primary Examiner* — Patrick E Demosky
(74) *Attorney, Agent, or Firm* — Conley Rose, P.C.

(57) ABSTRACT

Systems, methods and apparatus for encoding, decoding or transcoding digital video are described. One example method of video processing includes performing a conversion between a video and a bitstream of the video, wherein the bitstream conforms to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process includes replacing parameter sets with replacement parameter sets prior to removing, from an output bitstream, the SEI NAL units.

20 Claims, 11 Drawing Sheets

(51) Int. Cl.
    *C23F 1/26*       (2006.01)
    *C23F 1/28*       (2006.01)
    *H01L 21/3213*    (2006.01)
    *H04N 19/169*     (2014.01)
    *H04N 19/46*      (2014.01)

(52) U.S. Cl.
    CPC ..... *H01L 21/32134* (2013.01); *H04N 19/188* (2014.11)

(56) References Cited

U.S. PATENT DOCUMENTS

| | | |
|---|---|---|
| 2015/0271529 A1 | 9/2015 | Wang |
| 2015/0358640 A1 | 12/2015 | Hendry |
| 2017/0006311 A1 | 1/2017 | Hannuksela |
| 2018/0278964 A1 | 9/2018 | Wang |
| 2019/0116366 A1 | 4/2019 | Andrivon |
| 2019/0253726 A1 | 8/2019 | Tabatabai |
| 2020/0036982 A1 | 1/2020 | Narasimhan |
| 2021/0392332 A1 | 12/2021 | Choi |
| 2023/0037902 A1 | 2/2023 | Sanchez De La Fuente |

OTHER PUBLICATIONS

"Series H: Audiovisual and Multimedia Systems Infrastructure of audiovisual services—Coding of moving video High efficiency video coding," Rec. ITU-T H.265 | ISO/IEC 23008-2 (in force edition), Feb. 2018, 692 pages.
Document: JVET-G1001-v1, Chen, J., et al., "Algorithm description of Joint Exploration Test Model 7 (JEM7)," Joint Video Exploration Team (JVET) of ITU-T SG 16 WP 3 and ISO/IEC JTC 1/SC 29/WG 11 7th Meeting: Torino, IT, Jul. 13-21, 2017, 50 pages.
"Series H: Audiovisual and Multimedia Systems Infrastructure of audiovisual services—Coding of moving video Versatile video coding," Rec. ITU-T H.266 | ISO/IEC 23090-3, Aug. 2020, 516 pages.
Document: JVET-S2001-vH, Bross, B., et al., "Versatile Video Coding (Draft 10)," Joint Video Experts Team (JVET) of ITU-T SG 16 WP 3 and ISO/IEC JTC 1/SC 29/WG 11 19th Meeting: by teleconference, Jun. 22-Jul. 1, 2020, 548 pages.
"Series H: Audiovisual and Multimedia Systems Infrastructure of audiovisual services—Coding of moving video Versatile supplemental enhancement information messages for coded video bitstreams" Rec. ITU-T Rec. H.274 | ISO/IEC 23002-7, Aug. 2020, 86 pages.
Document: JVET-S2007-v7, Boyce, J., et al., "Versatile supplemental enhancement information messages for coded video bitstreams (Draft 5)," Joint Video Experts Team (JVET) of ITU-T SG 16 WP 3 and ISO/IEC JTC 1/SC 29/WG 11 18th Meeting: by teleconference, Apr. 15-24, 2020, 85 pages.
ISO/IEC JTC 1, "Information technology—Coding of audio-visual objects—Part 12: ISO base media file format, Technical Corrigendum 1," ISO/IEC 14496-12, Jun. 3, 2016, 303 pages.
"Information technology—Dynamic adaptive streaming over HTTP (DASH)—Part 1: Media presentation description and segment formats," ISO/IEC 23009-1, May 15, 2014, 152 pages.
Document: JVET-S0154-v1, Wang, Y.K., et al., "AHG9/AHG8/AHG12: On the subpicture sub-bitstream extraction process," Joint Video Experts Team (JVET) of ITU-T SG 16 WP 3 and ISO/IEC JTC 1/SC 29/WG 11 19th Meeting: by teleconference, Jun. 22-Jul. 1, 2020, pages.
Document: JVET-S0158-v1, Wang, Y.K., et al., "AHG9/AHG8: On the general sub-bitstream extraction process," Joint Video Experts Team (JVET) of ITU-T SG 16 WP 3 and ISO/IEC JTC 1/SC 29/WG 11 19th Meeting: by teleconference, Jun. 22-Jul. 1, 2020, 4 pages.
Document: JVET-S0141-v4, Deshpande, S., et al., "AHG9: A Summary of Proposals Related to HRD," Joint Video Experts Team (JVET) of ITU-T SG 16 WP 3 and ISO/IEC JTC 1/SC 29/WG 11 19th Meeting: by teleconference, Jun. 22-Jul. 1, 2020, 26 pages.
Foreign Communication From a Related Counterpart Application, PCT Application No. PCT/CN2021/120530, International Search Report dated Dec. 31, 2021, 10 pages.
Foreign Communication From a Related Counterpart Application, PCT Application No. PCT/CN2021/120531, International Search Report dated Dec. 31, 2021, 9 pages.
Non-Final Office Action dated Jun. 20, 2023, 11 pages, U.S. Appl. No. 18/190,612, filed Mar. 27, 2023.
Document: JVET-Q0397-v1, Skupin, R., et al., "AHG12: On subpicture extraction," Joint Video Experts Team (JVET) of ITU-T SG 16 WP 3 and ISO/IEC JTC 1/SC 29/WG 11, 17th Meeting: Brussels, BE, Jan. 7-17, 2020, 6 pages.
Document: JVET-S0178-v1, Wang, Y.K., et al., "AHG9: General SEI semantics and constraints," Joint Video Experts Team (JVET) of ITU-T SG 16 WP 3 and ISO/IEC JTC 1/SC 29/WG 11, 19th Meeting: by teleconference, Jun. 22-Jul. 1, 2020, 5 pages.
Extended European Search Report from European Application No. 21871625.6 dated Feb. 6, 2024, 8 pages.

\* cited by examiner

SUB-BITSTREAM EXTRACTION

CROSS-REFERENCE TO RELATED APPLICATION

This application is a continuation of International Patent Application No. PCT/CN2021/120531, filed on Sep. 26, 2021, which claims the priority to and benefits of International Patent Application No. PCT/CN2020/117596, filed on Sep. 25, 2020. All the aforementioned patent applications are hereby incorporated by reference in their entireties.

TECHNICAL FIELD

This patent document relates to generation, storage and consumption of digital audio video media information in a file format.

BACKGROUND

Digital video accounts for the largest bandwidth use on the internet and other digital communication networks. As the number of connected user devices capable of receiving and displaying video increases, it is expected that the bandwidth demand for digital video usage will continue to grow.

SUMMARY

The present document discloses techniques that can be used by video encoders and decoders for processing coded representation of a video or an image according to a file format.

In one example aspect, a video processing method is disclosed. The method includes performing a conversion between a video and a bitstream of the video comprising multiple layers, wherein the bitstream comprises a plurality of supplemental enhancement information, SEI, messages associated with an access unit, access unit (AU), or a decoding unit (DU) of a particular output layer set (OLS) or a particular layer, wherein the plurality of SEI messages, comprising a message type different from scalable nesting type, is based on a format rule, and wherein the format rule specifies that each of the plurality of SEI messages has a same SEI payload content due to the plurality of SEI messages being associated with the AU or the DU of the particular OLS or the particular layer.

In another example aspect, another video processing method is disclosed. The method includes performing a conversion between a video comprising a current block and a bitstream of the video, wherein the bitstream conforms to a format rule, and wherein the format rule specifies a constraint on the bitstream due to a syntax field being excluded from the bitstream, the syntax field being indicative of a picture order count associated with a current picture comprising the current block or a current access unit comprising the current block.

In yet another example aspect, another video processing method is disclosed. The method includes performing a conversion between a video and a bitstream of the video, wherein the bitstream conforms to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process comprises replacing parameter sets with replacement parameter sets prior to removing, from an output bitstream, the SEI NAL units.

In yet another example aspect, a video encoder apparatus is disclosed. The video encoder comprises a processor configured to implement above-described methods.

In yet another example aspect, a video decoder apparatus is disclosed. The video decoder comprises a processor configured to implement above-described methods.

In yet another example aspect, a computer readable medium having code stored thereon is disclose. The code embodies one of the methods described herein in the form of processor-executable code.

In yet another example aspect, a computer readable medium having a bitstream stored thereon is disclosed. The bitstream is generated or processed using a method described in the present document.

These, and other, features are described throughout the present document.

DETAILED DESCRIPTION

Figure 1:
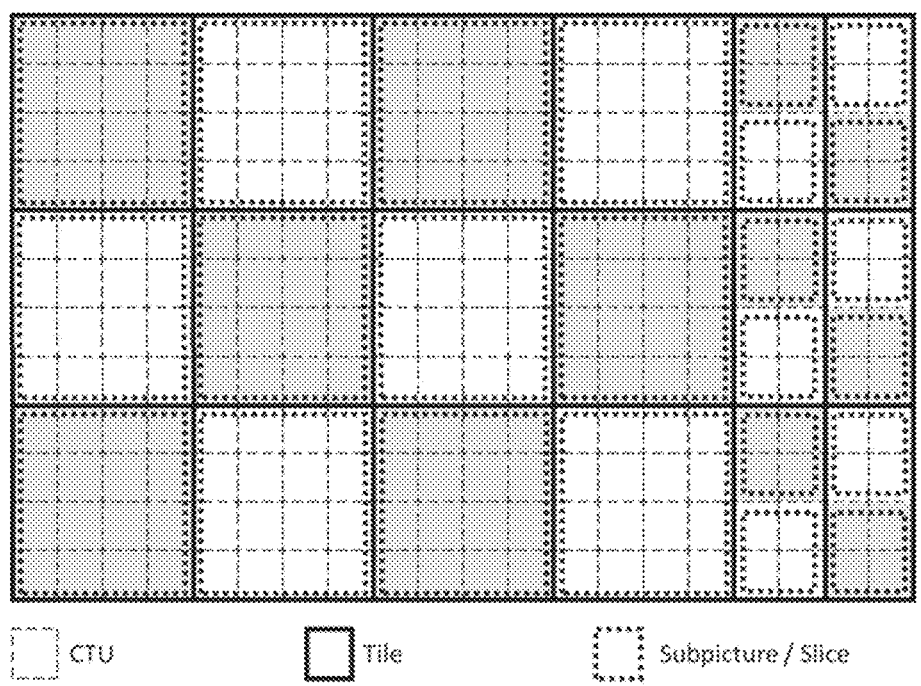
FIG. 1 shows a picture partitioned into 18 tiles, 24 slices and 24 subpictures.

Section headings are used in the present document for ease of understanding and do not limit the applicability of techniques and embodiments disclosed in each section only to that section. Furthermore, H.266 terminology is used in some description only for ease of understanding and not for limiting scope of the disclosed techniques. As such, the techniques described herein are applicable to other video codec protocols and designs also.

1. INITIAL DISCUSSION

This document is related to video coding technologies. Specifically, it is related to Picture Order Count (POC), Supplemental Enhancement Information (SEI), and subpicture sub-bitstream extraction. The ideas may be applied individually or in various combination, to any video coding standard or non-standard video codec, e.g., the recently finalized Versatile Video Coding (VVC).

2. ABBREVIATIONS

ACT adaptive colour transform
ALF adaptive loop filter

AMVR adaptive motion vector resolution
APS adaptation parameter set
AU access unit
AUD access unit delimiter
AVC advanced video coding (Rec. ITU-T H.264 ISO/IEC 14496-10)
B bi-predictive
BCW bi-prediction with CU-level weights
BDOF bi-directional optical flow
BDPCM block-based delta pulse code modulation
BP buffering period
CABAC context-based adaptive binary arithmetic coding
CB coding block
CBR constant bit rate
CCALF cross-component adaptive loop filter
CLVS coded layer video sequence
CLVSS coded layer video sequence start
CPB coded picture buffer
CRA clean random access
CRC cyclic redundancy check
CTB coding tree block
CTU coding tree unit
CU coding unit
CVS coded video sequence
CVSS coded video sequence start
DPB decoded picture buffer
DCI decoding capability information
DRAP dependent random access point
DU decoding unit
DUI decoding unit information
EG exponential-Golomb
EGk k-th order exponential-Golomb
EOB end of bitstream
EOS end of sequence
FD filler data
FIFO first-in, first-out
FL fixed-length
GBR green, blue, and red
GCI general constraints information
GDR gradual decoding refresh
GPM geometric partitioning mode
HEVC high efficiency video coding (Rec. ITU-T H.265 ISO/IEC 23008-2)
HRD hypothetical reference decoder
HSS hypothetical stream scheduler
I intra
IBC intra block copy
IDR instantaneous decoding refresh
ILRP inter-layer reference picture
IRAP intra random access point
LFNST low frequency non-separable transform
LPS least probable symbol
LSB least significant bit
LTRP long-term reference picture
LMCS luma mapping with chroma scaling
MIP matrix-based intra prediction
MPS most probable symbol
MSB most significant bit
MTS multiple transform selection
MVP motion vector prediction
NAL network abstraction layer
OLS output layer set
OP operation point
OPI operating point information
P predictive
PH picture header
POC picture order count
PPS picture parameter set
PROF prediction refinement with optical flow
PT picture timing
PU picture unit
QP quantization parameter
RADL random access decodable leading (picture)
RASL random access skipped leading (picture)
RBSP raw byte sequence payload
RGB red, green, and blue
RPL reference picture list
SAO sample adaptive offset
SAR sample aspect ratio
SEI supplemental enhancement information
SH slice header
SLI subpicture level information
SODB string of data bits
SPS sequence parameter set
STRP short-term reference picture
STSA step-wise temporal sublayer access
TR truncated rice
TU transform unit
VBR variable bit rate
VCL video coding layer
VPS video parameter set
VSEI versatile supplemental enhancement information (Rec. ITU-T H.274 ISO/IEC 23002-7)
VUI video usability information
VVC versatile video coding (Rec. ITU-T H.266 I ISO/IEC 23090-3)

3. VIDEO CODING REVIEW

Video coding standards have evolved primarily through the development of the well-known International Telecommunication Union-Telecommunication Standardization Sector (ITU-T) and International Organization for Standardization (ISO)/International Electrotechnical Commission (IEC) standards. The ITU-T produced H.261 and H.263, ISO/IEC produced Moving Picture Experts Group (MPEG)-1 and MPEG-4 Visual, and the two organizations jointly produced the H.262/MPEG-2 Video and H.264/MPEG-4 Advanced Video Coding (AVC) and H.265/High Efficiency Video Coding (HEVC) standards. Since H.262, the video coding standards are based on the hybrid video coding structure wherein temporal prediction plus transform coding are utilized. To explore the future video coding technologies beyond HEVC, the Joint Video Exploration Team (JVET) was founded by Video Coding Experts Group (VCEG) and MPEG jointly in 2015. Since then, many new methods have been adopted by JVET and put into the reference software named Joint Exploration Model (JEM). The JVET was later renamed to be the Joint Video Experts Team (JVET) when the Versatile Video Coding (VVC) project officially started. VVC is the new coding standard, targeting at 50% bitrate reduction as compared to HEVC, that has been finalized by the JVET at its 19th meeting ended at Jul. 1, 2020.

The Versatile Video Coding (VVC) standard (ITU-T H.266 I ISO/IEC 23090-3) and the associated Versatile Supplemental Enhancement Information (VSEI) standard (ITU-T H.274|ISO/IEC 23002-7) have been designed for use in a maximally broad range of applications, including both the traditional uses such as television broadcast, video conferencing, or playback from storage media, and also newer and more advanced use cases such as adaptive bit rate streaming, video region extraction, composition and merging of content from multiple coded video bitstreams, multiview video, scalable layered coding, and viewport-adaptive 360° immersive media.

3.1. Picture Order Count (POC) in HEVC and VVC

In HEVC and VVC, POC is basically used as a picture ID for identification of pictures in many parts of the decoding process, including decoded picture buffer (DPB) management, part of which is reference picture management.

With the newly introduced picture header (PH), in VVC, the information of POC least significant bits (LSB), which is used for deriving the POC value and has the same value for all slices of a picture, is signaled in the PH, as opposed to HEVC where it is signaled in the slice header (SH). VVC also allows the signaling of the POC most significant bits (MSB) cycle value in the PH, to enable the derivation of the POC value without tracking the POC MSB, which relies on the POC information of earlier decoded pictures. This, for example, allows mixing of intra random access point (IRAP) and non-IRAP pictures within an AU in multi-layer bitstreams. An additional difference between POC signaling in HEVC and VVC is that in HEVC the POC LSB is not signaled for instantaneous decoding refresh (IDR) pictures, which turned out to show some disadvantage during later development of the multi-layer extensions of HEVC, for enabling mixing of IDR and non-IDR pictures within an AU. Therefore, in VVC POC LSB information is signaled for each picture, including IDR pictures. The signaling of POC LSB information for IDR pictures also make it easier for supporting of merging of an IDR picture and a non-IDR picture from different bitstream into one picture, as otherwise handling of the POC LSB in the merged picture would need some complicated design.

The decoding process for POC in VVC is specified as follows:

8.3.1 Decoding Process for Picture Order Count

Output of this process is PicOrderCntVal, the picture order count of the current picture.

Each coded picture is associated with a picture order count variable, denoted as PicOrderCntVal.

Let the variable currLayerIdx be set equal to GeneralLayerIdx[nuh_layer_id].

PicOrderCntVal is derived as follows:

If vps_independent_layer_flag[currLayerIdx] is equal to 0 and there is a picture picA in the current AU with nuh_layer_id equal to layerIdA such that GeneralLayerIdx[layerIdA] is in the list ReferenceLayerIdx[currLayerIdx], PicOrderCntVal is derived to be equal to the PicOrderCntVal of picA, and the value of ph_pic_order_cnt_lsb shall be the same in all video coding layer (VCL) NAL units of the current AU.

Otherwise, and PicOrderCntVal of the current picture is derived as specified in the remainder of this subclause.

When ph_poc_msb_cycle_val is not present and the current picture is not a coded layer video sequence (CLVS) start (CLVSS) picture, the variables prevPicOrderCntLsb and prevPicOrderCntMsb are derived as follows:

Let prevTid0Pic be the previous picture in decoding order that has nuh_layer_id equal to the nuh_layer_id of the current picture, has TemporalId and ph_non_ref_pic_flag both equal to 0, and is not a random access skipped leading (RASL) or random access decodable leading (RADL) picture.

NOTE 1—In a sub-bitstream consisting of only intra pictures, extracted from a single-layer bitstream and used in intra-picture-only trick play, the prevTid0Pic is the previous intra picture in decoding order. To ensure correct POC derivation, encoders could choose either to include ph_poc_msb_cycle_val for intra picture, or set the value of sps_log2_max_pic_order_cnt_lsb_minus4 to be large enough such that the POC difference between the current picture and the prevTid0Pic is less than MaxPicOrderCntLsb/2.

NOTE 2—When vps_max_tid_11_ref_pics_plus1[i][j] is equal to 0 for any value of i among the layer indices and j equal to the layer index of the current layer, the prevTid0Pic in the extracted sub-bitstream for some of the OLSs would be the previous IRAP or gradual decoding refresh (GDR) picture with ph_recovery_poc_cnt equal to 0 in the current layer in decoding order. To ensure such a sub-bitstream to be a conforming bitstream, encoders could choose either to include ph_poc_msb_cycle_val for each IRAP or GDR picture with ph_recovery_poc_cnt equal to 0, or set the value of sps_log2_max_pic_order_cnt_lsb_minus4 to be large enough such that the POC difference between the current picture and the prevTid0Pic is less than MaxPicOrderCntLsb/2.

The variable prevPicOrderCntLsb is set equal to ph_pic_order_cnt_lsb of prevTid0Pic.

The variable prevPicOrderCntMsb is set equal to PicOrderCntMsb of prevTid0Pic.

The variable PicOrderCntMsb of the current picture is derived as follows:

If ph_poc_msb_cycle_val is present, PicOrderCntMsb is set equal to ph_poc_msb_cycle_val*MaxPicOrderCntLsb.

Otherwise (ph_poc_msb_cycle_val is not present), if the current picture is a CLVSS picture, PicOrderCntMsb is set equal to 0.

Otherwise, PicOrderCntMsb is derived as follows:

if ((ph_pic_order_cnt_lsb<prevPicOrderCntLsb) &&
((prevPicOrderCntLsb−ph_pic_order_cnt_lsb)>=
(MaxPicOrderCntLsb/2)))
PicOrderCntMsb=prevPicOrderCntMsb+MaxPicOrderCntLsb (196)

else if ((ph_pic_order_cnt_lsb>prevPicOrderCntLsb)
&& ((ph_pic_order_cnt_lsb−prevPicOrderCntLsb)>(MaxPicOrderCntLsb/2)))
PicOrderCntMsb=prevPicOrderCntMsb−MaxPicOrderCntLsb else PicOrderCntMsb=prevPicOrderCntMsb PicOrderCntVal is derived as follows:

PicOrderCntVal=PicOrderCntMsb+ph_pic_order_cnt_lsb (197)

NOTE 3—All CLVSS pictures for which ph_poc_msb_cycle_val is not present have PicOrderCntVal equal to ph_pic_order_cnt_lsb since for those pictures PicOrderCntMsb is set equal to 0.

The value of PicOrderCntVal shall be in the range of $-2^{31}$ to $2^{31}-1$, inclusive.

In one coded video sequence (CVS), the PicOrderCntVal values for any two coded pictures with the same value of nuh_layer_id shall not be the same.

All pictures in any particular AU shall have the same value of PicOrderCntVal.
The function PicOrderCnt(picX) is specified as follows:

$$\text{PicOrderCnt}(picX) = \text{PicOrderCntVal of the picture } picX \quad (198)$$

The function DiffPicOrderCnt(picA, picB) is specified as follows:

$$\text{DiffPicOrderCnt}(picA, picB) = \text{PicOrderCnt}(picA) - \text{PicOrderCnt}(picB) \quad (199)$$

The bitstream shall not contain data that result in values of DiffPicOrderCnt(picA, picB) used in the decoding process that are not in the range of $-2^{15}$ to $2^{15}-1$, inclusive.

> NOTE 4—Let X be the current picture and Y and Z be two other pictures in the same CVS, Y and Z are considered to be in the same output order direction from X when both DiffPicOrderCnt(X, Y) and DiffPicOrderCnt(X, Z) are positive or both are negative.

3.2. VUI and SEI Messages

Video usability information (VUI) is a syntax structure sent as part of the SPS (and possibly also in VPS in HEVC). VUI carries information that does not affect the normative decoding process, but that can be important for proper rendering of the coded video.

SEI assists in processes related to decoding, display or other purposes. Same as VUI, SEI does not affect the normative decoding process, either. SEI is carried in SEI messages. Decoder support of SEI messages is optional. However, SEI messages do affect bitstream conformance (e.g., if the syntax of an SEI message in a bitstream does not follow the specification, then the bitstream is not conforming) and some SEI messages are needed in the hypothetical reference decoder (HRD) specification.

The VUI syntax structure and most SEI messages used with VVC are not specified in the VVC specification, but rather in the VVC SEI (VSEI) specification. The SEI messages necessary for HRD conformance testing are specified in the VVC specification. VVC v1 defines five SEI messages relevant for HRD conformance testing and VSEI v1 specifies 20 additional SEI messages. The SEI messages carried in the VSEI specification do not directly impact conforming decoder behavior and have been defined so that they can be used in a coding-format-agnostic manner, allowing VSEI to be used in the future with other video coding standards in addition to VVC. Rather than referring specifically to VVC syntax element names, the VSEI specification refers to variables, whose values are set within the VVC specification.

Compared to HEVC, the VUI syntax structure of VVC focuses only on information relevant for proper rendering of the pictures and does not contain any timing information or bitstream restriction indications. In VVC, the VUI is signaled within the SPS, which includes a length field before the VUI syntax structure to signal the length of the VUI payload in bytes. This makes it possible for a decoder to easily jump over the information, and more importantly, allows convenient future VUI syntax extensions by directly adding new syntax elements to the end of the VUI syntax structure, in a similar manner as SEI message syntax extension.

The VUI syntax structure contains the following information:
- The content being interlaced or progressive;
- Whether the content contains frame-packed stereoscopic video or projected omnidirectional video;
- Sample aspect ratio;
- Whether the content is appropriate for overscan display;
- Color description, including color primaries, matrix and transfer characteristics, which is particularly important to be able to signal ultra high definition (UHD) vs high definition (HD) color space as well as high dynamic range (HDR);
- Chroma location compared to luma (for which the signaling was clarified for progressive content compared to HEVC).

When the SPS does not contain any VUI, the information is considered unspecified and has to be conveyed via external means or specified by the application if the content of the bitstream is intended for rendering on a display.

Table 1 lists all the SEI messages specified for VVC v1, as well as the specification containing their syntax and semantics. Of the 20 SEI messages specified in the VSEI specification, many were inherited from HEVC (for example, the filler payload and both user data SEI messages). Some SEI messages are essential for correct processing or rendering of the coded video content. This is for example the case for the mastering display color volume, the content light level information or the alternative transfer characteristics SEI messages which are particularly relevant for HDR content. Other examples include the equirectangular projection, sphere rotation, region-wise packing or omnidirectional viewport SEI messages, which are relevant for signaling and processing of 3600 video content.

TABLE 1

List of SEI messages in VVC v1

| Name of SEI message | Purpose of SEI message |
| --- | --- |
| SEI messages specified in the VVC specification | |
| Buffering period | Initial CPB removal delays for HRD |
| Picture timing | CPB removal delays and DPB output delays for HRD |
| Decoding unit information | CPB removal delays and DPB output delays for DU based HRD |
| Scalable nesting | Mechanism to associate SEI messages with specific output layer sets, layers or sets of subpictures |
| Subpicture level information | Information about levels for subpicture sequences |
| SEI messages specified in the VSEI specification | |
| Filler payload | Filler data for adjusting the bit rate |
| User data registered by Rec. ITU-T T.35 | Convey user data, can be used as container for data by other organizations |
| User data unregistered | |

TABLE 1-continued

List of SEI messages in VVC v1

| Name of SEI message | Purpose of SEI message |
| --- | --- |
| Film grain characteristics | Model for film grain synthesis |
| Frame packing arrangement | Information about how stereoscopic video is coded in the bitstream, e.g., by packing the two pictures for each time instance of the two views into one picture |
| Parameter sets inclusion indication | Indication of whether the sequence contains all the required NAL units for decoding |
| Decoded picture hash | Hash of the decoded pictures for error detection |
| Mastering display color volume | Description of the color volume of a display used to author the content |
| Content light level information | Upper bounds for the nominal target brightness light level of the content |
| Dependent RAP indication | Indicates a picture using only the preceding IRAP picture for inter prediction referencing |
| Alternative transfer characteristics | Preferred alternative value for the transfer characteristics of the content |
| Ambient viewing environment | Characteristics of the nominal ambient viewing environment for the display of the content, can be used to assist the receiver in processing content depending on the local viewing environment |
| Content color volume | Color volume characteristics of the associated picture |
| Equirectangular projection | Indication of the projection format applied, including information needed for remapping of the content onto a sphere for rendering in omnidirectional video applications |
| Generalized cubemap projection | |
| Sphere rotation | Information on rotation angles for conversion between the global and local coordinate axes, for use in omnidirectional video applications |
| Region-wise packing | Information needed for remapping of the cropped decoded pictures, involving region-wise operations like repositioning, resizing and rotation, onto projected pictures, for use in omnidirectional video applications |
| Omnidirectional viewport | Coordinates of one or more regions corresponding to viewports recommended for display, for use in omnidirectional video applications |
| Frame-field information | Indicates how the associated picture should be displayed, its source scan, and whether it is a duplicate of a previous picture |
| Sample aspect ratio information | Information about sample aspect ratio of the associated picture |

New SEI messages that were specified for VVC v1 include the frame-field information SEI message, the sample aspect ratio information SEI message, and the subpicture level information SEI message.

The frame-field information SEI message contains information to indicate how the associated picture should be displayed (such as field parity or frame repetition period), the source scan type of the associated picture and whether the associated picture is a duplicate of a previous picture. This information used to be signaled in the picture timing SEI message in previous video coding standards, together with the timing information of the associated picture. However, it was observed that the frame-field information and timing information are two different kinds of information that are not necessarily signaled together. A typical example consists in signaling the timing information at the systems level, but signaling the frame-field information within the bitstream. It was therefore decided to remove the frame-field information from the picture timing SEI message and signal it within a dedicated SEI message instead. This change also made it possible to modify the syntax of the frame-field information to convey additional and clearer instructions to the display, such as the pairing of fields together, or more values for frame repetition.

The sample-aspect ratio SEI message enables signaling different sample aspect ratios for different pictures within the same sequence, whereas the corresponding information contained in the VUI applies to the whole sequence. It may be relevant when using the reference picture resampling feature with scaling factors that cause different pictures of the same sequence to have different sample aspect ratios.

The subpicture level information SEI message provides information of levels for the subpicture sequences.

3.3. Picture Partitioning and Subpictures in VVC

In VVC, A picture is divided into one or more tile rows and one or more tile columns. A tile is a sequence of coding tree units (CTUs) that covers a rectangular region of a picture. The CTUs in a tile are scanned in raster scan order within that tile.

A slice consists of an integer number of complete tiles or an integer number of consecutive complete CTU rows within a tile of a picture.

Two modes of slices are supported, namely the raster-scan slice mode and the rectangular slice mode. In the raster-scan slice mode, a slice contains a sequence of complete tiles in a tile raster scan of a picture. In the rectangular slice mode, a slice contains either a number of complete tiles that collectively form a rectangular region of the picture or a number of consecutive complete CTU rows of one tile that collectively form a rectangular region of the picture. Tiles within a rectangular slice are scanned in tile raster scan order within the rectangular region corresponding to that slice.

A subpicture contains one or more slices that collectively cover a rectangular region of a picture.

3.3.1. Subpicture Concept and Functionality

In VVC, each subpicture consists of one or more complete rectangular slices that collectively cover a rectangular region of the picture, e.g., as shown in FIG. 1. A subpicture may be either specified to be extractable (i.e., coded independently of other subpictures of the same picture and of earlier pictures in decoding order) or not extractable. Regardless of whether a subpicture is extractable or not, the encoder can control whether in-loop filtering (including deblocking, sample adaptive offset (SAO), and adaptive loop filter (ALF)) is applied across the subpicture boundaries individually for each subpicture.

Functionally, subpictures are similar to the motion-constrained tile sets (MCTSs) in HEVC. They both allow independent coding and extraction of a rectangular subset of a sequence of coded pictures, for use cases like viewport-dependent 3600 video streaming optimization and region of interest (ROI) applications.

In streaming of 3600 video, a.k.a. omnidirectional video, at any particular moment only a subset (i.e., the current viewport) of the entire omnidirectional video sphere would be rendered to the user, while the user can turn his/her head anytime to change the viewing orientation and consequently the current viewport. While it is desirable to have at least some lower-quality representation of the area not covered by the current viewport available at the client and ready to be rendered to the user just in case the user suddenly changes his/her viewing orientation to anywhere on the sphere, a high-quality representation of the omnidirectional video is only needed for the current viewport that is being rendered to the user at any given moment. Splitting the high-quality representation of the entire omnidirectional video into subpictures at an appropriate granularity enables such an optimization as shown in FIG. 1 with 12 high-resolution subpictures on the left-hand side and the remaining 12 subpictures of the omnidirectional video in lower resolution on the right-hand side.

Figure 2:
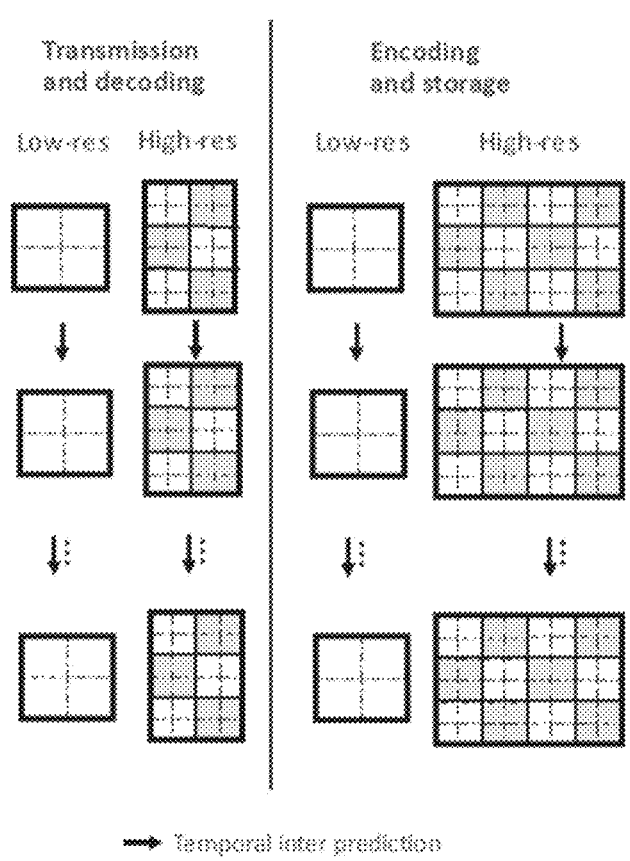
FIG. 2 shows a typical subpicture-based viewport-dependent three hundred sixty degree (360°) video delivery scheme.

Another typical subpicture-based viewport-dependent 3600 video delivery scheme is shown in FIG. 2 wherein only a higher-resolution representation of the full video consists of subpictures, while a lower-resolution representation of the full video does not use subpictures and can be coded with less frequent RAPs than the higher-resolution representation. The client receives the full video in the lower-resolution while for the higher-resolution video, the client only receives and decodes the subpictures that cover the current viewport.

3.3.2. Differences Between Subpictures and MCTSs

There are several important design differences between subpictures and MCTSs. First, the subpictures feature in VVC allows motion vectors of a coding block pointing outside of the subpicture even when the subpicture is extractable by applying sample padding at subpicture boundaries in this case, similarly as at picture boundaries. Second, additional changes were introduced for the selection and derivation of motion vectors in the merge mode and in the decoder side motion vector refinement process of VVC. This allows higher coding efficiency compared to the non-normative motion constraints applied at encoder-side for MCTSs. Third, rewriting of SHs (and PH NAL units, when present) is not needed when extracting one or more extractable subpictures from a sequence of pictures to create a sub-bitstream that is a conforming bitstream. In sub-bitstream extractions based on HEVC MCTSs, rewriting of SHs is needed. Note that in both HEVC MCTSs extraction and VVC subpictures extraction, rewriting of sequence parameter sets (SPSs) and picture parameter sets (PPSs) is needed. However, typically there are only a few parameter sets in a bitstream, while each picture has at least one slice, therefore rewriting of SHs can be a significant burden for application systems. Fourth, slices of different subpictures within a picture are allowed to have different NAL unit types. This is the feature often referred to as mixed NAL unit types or mixed subpicture types within a picture, discussed in more detail below. Fifth, VVC specifies HRD and level definitions for subpicture sequences, thus the conformance of the sub-bitstream of each extractable subpicture sequence can be ensured by encoders.

3.3.3. Mixed Subpicture Types within a Picture

In AVC and HEVC, all VCL NAL units in a picture need to have the same NAL unit type. VVC introduces the option to mix subpictures with certain different VCL NAL unit types within a picture, thus providing support for random access not only at the picture level but also at the subpicture level. In VVC VCL NAL units within a subpicture are still required to have the same NAL unit type.

The capability of random accessing from IRAP subpictures is beneficial for 3600 video applications. In viewport-dependent 3600 video delivery schemes similar to the one shown in FIG. 2 the content of spatially neighboring viewports largely overlaps, i.e. only a fraction of subpictures in a viewport is replaced by new subpictures during a viewport orientation change, while most subpictures remain in the viewport. Subpicture sequences that are newly introduced into the viewport must begin with IRAP slices but significant reduction in overall transmission bit rate can be achieved when the remaining subpictures are allowed to carry out inter-prediction at viewport changes.

The indication of whether a picture contains just a single type of NAL units or more than one type is provided in the PPS referred to by the picture (i.e., using a flag called pps_mixed_nalu_types_in_pic_flag). A picture may consist of subpictures containing IRAP slices and subpictures containing trailing slices at the same time. A few other combinations of different NAL unit types within a picture are also allowed, including leading picture slices of NAL unit types RASL and RADL, which allows the merging of subpicture sequences with open-GOP and close-GOP coding structures extracted from different bitstreams into one bitstream.

3.3.4. Subpicture Layout and ID Signaling

The layout of subpictures in VVC is signaled in the SPS, thus constant within a CLVS. Each subpicture is signaled by the position of its top-left CTU and its width and height in number of CTUs, therefore ensuring that a subpicture covers a rectangular region of the picture with CTU granularity. The order in which the subpictures are signaled in the SPS determines the index of each subpicture within the picture.

Figure 3:
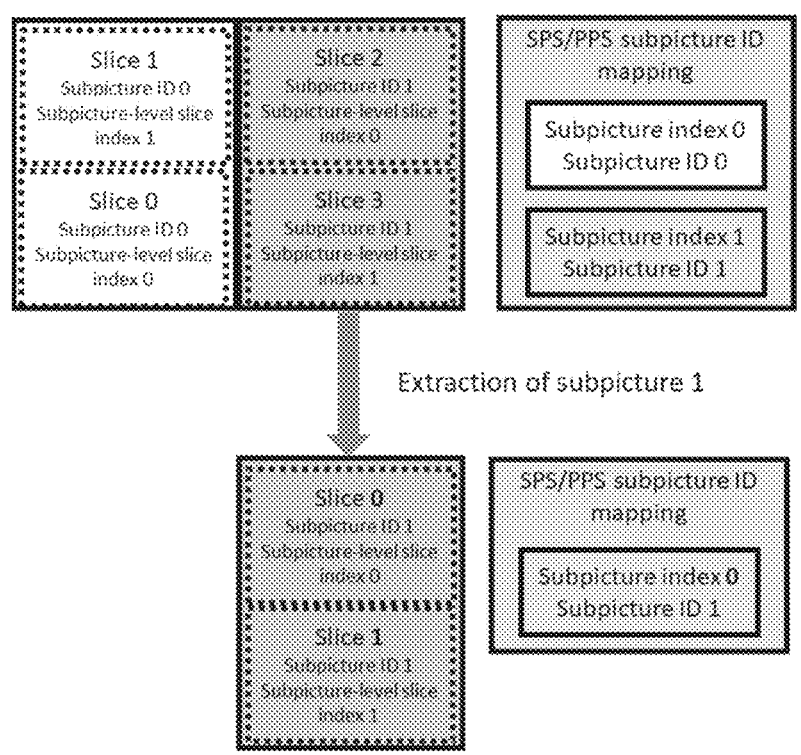
FIG. 3 shows an example of extraction of one subpicture from a bitstream containing two subpictures and four slices.

For enabling extraction and merging of subpicture sequences without rewriting of SHs or PHs, the slice addressing scheme in VVC is based on subpicture IDs and a subpicture-specific slice index to associate slices to subpictures. In the SH, the subpicture ID of the subpicture containing the slice and the subpicture-level slice index are signaled. Note that the value of subpicture ID of a particular subpicture can be different from the value of its subpicture index. A mapping between the two is either signaled in the SPS or PPS (but never both) or implicitly inferred. When present, the subpicture ID mapping needs to be rewritten or added when rewriting the SPSs and PPSs during the subpicture sub-bitstream extraction process. The subpicture ID and the subpicture-level slice index together indicate to the decoder the exact position of the first decoded CTU of a slice within the DPB slot of the decoded picture. After subbitstream extraction, the subpicture ID of a subpicture remains unchanged while the subpicture index may change. Even when the raster-scan CTU address of the first CTU in a slice in the subpicture has changed compared to the value in the original bitstream, the unchanged values of subpicture ID and subpicture-level slice index in the respective SH would still correctly determine the position of each CTU in the decoded picture of the extracted sub-bitstream. FIG. 3 illustrates the usage of subpicture ID, subpicture index and subpicture-level slice index to enable subpicture extraction with an example containing two subpictures and four slices.

Similar to subpicture extraction, the signaling for subpictures allows merging several subpictures from different bitstreams into a single bitstream by only rewriting the SPSs and PPSs, provided that the different bitstreams are coordinately generated (e.g., using distinct subpicture IDs but otherwise mostly aligned SPS, PPS and PH parameters such as CTU size, chroma format, coding tools, etc.).

While subpictures and slices are independently signaled in the SPS and PPS, respectively, there are inherent reciprocal constraints between the subpicture and slice layouts in order to form a conformant bitstream. First, the presence of subpictures requires using rectangular slices and forbids raster-scan slices. Second, the slices of a given subpicture shall be consecutive NAL units in decoding order, which means that the subpicture layout constrains the order of coded slice NAL units within the bitstream.

3.4. General Sub-Bitstream Extraction Processes in VVC

Similar to HEVC, the VVC specification includes a sub-bitstream extraction process that allows to extract the sub-bitstream corresponding to a particular operation point (i.e., an OLS and the included temporal sublayers). While in HEVC, the extraction process is part of the decoding process, i.e. the decoder would need to discard NAL units not relevant for the operation point when present in the bitstream, the VVC design assumes that the bitstream fed to the decoder does not contain NAL units not belonging to the indicated operation point, i.e., when needed, NAL units not relevant for the operation point are discarded by the extractor that is not part of the decoder. A notable difference compared to HEVC is that in VVC the handling of scalable nested HRD SEI messages is normatively specified, e.g., the extracted bitstream carries correct HRD timing parameters for the target operation point. The process includes removing the original buffering period (BP) SEI messages, and, if any, decoding unit information (DUI) SEI messages and inserting the appropriate SEI messages originally included in a scalable nesting SEI message when the target operation point does not include all layers in the bitstream. Picture timing (PT) SEI messages have, however, a special handling; the above operations are only needed when it is not indicated that each PT SEI message applies to all OLSs.

The specification of the general sub-bitstream extraction process is VVC is as follows:
C.6 General Sub-Bitstream Extraction Process
Inputs to this process are a bitstream inBitstream, a target OLS index targetOlsIdx, and a target highest TemporalId value tIdTarget.

Output of this process is a sub-bitstream outBitstream.
The OLS with OLS index targetOlsIdx is referred to as the target OLS.
It is a requirement of bitstream conformance for the input bitstream that any output sub-bitstream that satisfies all of the following conditions shall be a conforming bitstream:
  The output sub-bitstream is the output of the process specified in this subclause with the bitstream, targetOlsIdx equal to an index to the list of OLSs specified by the VPS, and tIdTarget equal to any value in the range of 0 to vps_ptl_max_tid[vps_ols_ptl_idx[targetOlsIdx]], inclusive, as inputs.
  The output sub-bitstream contains at least one VCL NAL unit with nuh_layer_id equal to each of the nuh_layer_id values in LayerIdInOls[targetOlsIdx].
  The output sub-bitstream contains at least one VCL NAL unit with TemporalId equal to tIdTarget.
    NOTE—A conforming bitstream contains one or more coded slice NAL units with TemporalId equal to 0, but does not have to contain coded slice NAL units with nuh_layer_id equal to 0.
The output sub-bitstream OutBitstream is derived by applying the following ordered steps:
1. The bitstream outBitstream is set to be identical to the bitstream inBitstream.
2. Remove from outBitstream all NAL units with TemporalId greater than tIdTarget.
3. Remove from outBitstream all NAL units that have nuh_layer_id not included in the list LayerIdInOls[targetOlsIdx], and are not decoding capability information (DCI), operating point information (OPI), video parameter set (VPS), access unit delimiter (AUD), or end of bitstream (EOB) NAL units, and are not SEI NAL units containing non-scalable-nested SEI messages with payload PayloadType equal to 0, 1, 130, or 203.
4. Remove from outBitstream all adaptation parameter set (APS) and VCL NAL units for which all of the following conditions are true, and the associated non-VCL NAL units of these VCL NAL units with nal_unit_type equal to PH_NUT or FD_NUT, or with nal_unit_type equal to SUFFIX_SEI_NUT or PREFIX_SEI_NUT and containing SEI messages with PayloadType not equal to any of 0 (BP), 1 (PT), 130 (DUI), and 203 (subpicture level information (SLI)):
    nal_unit_type (NUT) is equal to APS_NUT, TRAIL_NUT, step-wise temporal sublayer access NUT (STSA_NUT), RADL_NUT, or RASL_NUT, or nal_unit_type is equal to GDR_NUT and the associated ph_recovery_poc_cnt is greater than 0.
    TemporalId is greater than or equal to NumSubLayersInLayerInOLS[targetOlsIdx][GeneralLayerIdx[nuh_layer_id]].
5. When all VCL NAL units of an AU are removed by steps 2, 3, or 4 above and an AUD or OPI NAL unit is present in the AU, remove the AUD or OPI NAL unit from outBitstream.
6. For each OPI NAL unit in outBitstream, set opi_htid_info_present_flag equal to 1, set opi_ols_info_present_flag equal to 1, set opi_htid_plus1 equal to tIdTarget+1, and set opi_ols_idx equal to targetOlsIdx.
7. When an AUD is present in an AU in outBitstream and the AU becomes an IRAP or GDR AU, set aud_irap_or_gdr_flag of the AUD equal to 1.
8. Remove from outBitstream all SEI NAL units that contain a scalable nesting SEI message that has sn_ols_flag equal to 1 and there is no value of i in the range of 0 to sn_num_olss_minus1, inclusive, such that NestingOlsIdx [i] is equal to targetOlsIdx.
9. Remove from outBitstream all SEI NAL units that contain a scalable nesting SEI message that has sn_ols_flag equal to 0 and there is no value in the list NestingLayerId equal to a value in the list LayerIdInOls[targetOlsIdx].
10. When LayerIdInOls[targetOlsIdx] does not include all values of nuh_layer_id in all VCL NAL units in the bitstream inBitstream, the following applies in the order listed:
    a. Remove from outBitstream all SEI NAL units that contain a non-scalable-nested SEI message with payloadType equal to 0 (BP), 130 (DUI), or 203 (SLI).
    b. When general_same_pic_timing_in_all_ols_flag is equal to 0, remove from outBitstream all SEI NAL units that contain a non-scalable-nested SEI message with payloadType equal to 1 (PT).
    c. When outBitstream contains an SEI NAL unit seiNalUnitA that contains a scalable nesting SEI message with sn_ols_flag equal to 1 and sn_subpic_flag equal to 0 that applies to the target OLS, or when NumLayersInOls[targetOlsIdx] is equal to 1 and outBitstream contains an SEI NAL unit seiNalUnitA that contains a scalable nesting SEI message with sn_ols_flag is equal to 0 and sn_subpic_flag equal to 0 that applies to the layer in outBitstream, generate a new SEI NAL unit seiNalUnitB, include it in the picture unit (PU) containing seiNalUnitA immediately after seiNalUnitA, extract the scalable-nested SEI messages from the scalable nesting SEI message and include them directly in seiNalUnitB (as non-scalable-nested SEI messages), and remove seiNalUnitA from outBitstream.

3.5. Subpicture Sub-Bitstream Extraction Process in VVC

VVC allows HRD conformance testing of individual independently coded subpictures, i.e., the bitstream portion related to individual subpictures can be extracted to form a valid bitstream and the conformance of that bitstream to an HRD model can be tested. Conformance testing requires definition of a complete HRD model for such a subpicture sub-bitstream and VVC allows to carry the necessary information, in addition to other HRD parameters, by means of a new SEI message referred to as the subpicture level information (SLI) SEI message.

The SLI SEI message provides level information for subpicture sequences, which is needed for deriving the coded picture buffer (CPB) size and the bit rate values of an HRD model that describes the processing of a subpicture bitstream by a decoder. While an original bitstream consisting of multiple subpictures may adhere to the limits defined by a particular level as indicated in the parameter sets of the bitstream (e.g., Level 5.1 for 4K at 60 Hz), a subpicture sub-bitstream of that particular bitstream may correspond to a lower level (e.g., Level 3 for 720p at 60 Hz). Furthermore, VVC allows expressing the level of a particular subpicture sub-bitstream by means of fractions of reference levels, which allows a more fine granular level signaling than in HEVC, and this information also provides guidance to systems that merge multiple subpictures into a single joint bitstream on how much each subpicture sub-bitstream will contribute towards the level limits of a merged bitstream. Additional properties such as the bitstream exhibiting a constant bit rate or, in case of multi-layer bitstreams, the level contribution of layers without subpicture partitioning applied can also be signaled in the SLI SEI message, thus enabling the derivation of a compete HRD model for each individual subpicture sequence also for such scenarios. A further part of the effort to allow conforming subpicture sub-bitstreams is to apply the numerous conformance related constraints that have a picture scope also with a subpicture scope, such as constraints on minimum compression ratio or the bin-to-bit ratio for the VCL NAL units that belong to an individual subpicture.

In HEVC, the sub-bitstream extraction and conformance testing of independently coded regions (i.e., MCTS) requires the parameter sets for such sub-bitstreams to be carried in a nested form by means of the MCTS extraction information set SEI message.

VVC adds a new subpicture sub-bitstream extraction process that allows generation of a conformant bitstream from an independently coded subpicture by removing the unnecessary NAL units associated to other subpictures and actively rewriting the relevant parts of the parameter sets to correctly reflect the properties of the subpicture sub-bitstream. For instance, this process includes rewriting the level indicators and HRD parameters in VPSs and SPSs, as well as the picture sizes, partitioning information, conformance window offsets, scaling window offsets, and virtual boundary positions in the appropriate section of the respective parameter sets. The subpicture sub-bitstream extraction process rewrites some of the information in the parameter sets of the bitstream based on the information provided in the SLI SEI message.

The specification of the subpicture sub-bitstream extraction process is VVC is as follows:

C.7 Subpicture Sub-Bitstream Extraction Process

Inputs to this process are a bitstream inBitstream, a target OLS index targetOlsIdx, a target highest TemporalId value tIdTarget, and a list of target subpicture index values subpicIdxTarget[i] for i from 0 to NumLayersInOls[targetOlsIdx]−1, inclusive.

Output of this process is a sub-bitstream outBitstream.

The OLS with OLS index targetOlsIdx is referred to as the target OLS. Among the layers in the target OLS, those for which the referenced SPSs have sps_num_subpics_minus1 greater than 0 are referred to as the multiSubpicLayers.

It is a requirement of bitstream conformance for the input bitstream that any output sub-bitstream that satisfies all of the following conditions shall be a conforming bitstream:

The output sub-bitstream is the output of the process specified in this subclause with the bitstream, targetOlsIdx equal to an index to the list of OLSs specified by the VPS, tIdTarget equal to any value in the range of 0 to vps_max_sublayers_minus1, inclusive, and the list subpicIdxTarget[i] for i from 0 to NumLayersInOls [targetOlsIdx]−1, inclusive, satisfying the following conditions, as inputs:
      The value of subpicIdxTarget[i] is equal to a value in the range of 0 to sps_num_subpics_minus1, inclusive, such that sps_subpic_treated_as_pic_flag[subpicIdxTarget[i]] is equal to 1, where sps_num_subpics_minus1 and sps_subpic_treated_as_pic_flag [subpicIdxTarget[i]] are found in or inferred based on the SPS referred to by the layer with nuh_layer_id equal to LayerIdInOls[targetOlsIdx][i].
         NOTE 1—When the sps_num_subpics_minus1 for the layer with nuh_layer_id equal to LayerIdInOls [targetOlsIdx][i] is equal to 0, the value of subpicIdxTarget[i] is equal to 0.
      For any two different integer values of m and n, when sps_num_subpics_minus1 is greater than 0 for both layers with nuh_layer_id equal to LayerIdInOls[targetOlsIdx][m] and LayerIdInOls[targetOlsIdx][n], respectively, subpicIdxTarget[m] is equal to subpicIdxTarget[n].

The output sub-bitstream contains at least one VCL NAL unit with nuh_layer_id equal to each of the nuh_layer_id values in the list LayerIdInOls[targetOlsIdx].

The output sub-bitstream contains at least one VCL NAL unit with TemporalId equal to tIdTarget.

NOTE 2—A conforming bitstream contains one or more coded slice NAL units with TemporalId equal to 0, but does not have to contain coded slice NAL units with nuh_layer_id equal to 0.

The output sub-bitstream contains at least one VCL NAL unit with nuh_layer_id equal to LayerIdInOls[targetOlsIdx][i] and with sh_subpic_id equal to SubpicIdVal[subpicIdxTarget[i]] for each i in the range of 0 to NumLayersInOls[targetOlsIdx]−1, inclusive.

The output sub-bitstream outBitstream is derived by the following order steps:

1. The sub-bitstream extraction process, specified in Annex C.6, is invoked with inBitstream, targetOlsIdx, and tIdTarget as inputs and the output of the process is assigned to outBitstream.
2. For each value of i in the range of 0 to NumLayersInOls[targetOlsIdx]−1, inclusive, remove from outBitstream all VCL NAL units with nuh_layer_id equal to LayerIdInOls[targetOlsIdx][i] and sh_subpic_id not equal to SubpicIdVal[subpicIdxTarget[i]], their associated filler data NAL units, and their associated SEI NAL units that contain filler payload SEI messages.
3. When an SLI SEI message that applies to the target OLS is present and sli_cbr_constraint_flag of the SLI SEI message is equal to 0, remove all NAL units with nal_unit_type equal to FD_NUT and SEI NAL units containing filler payload SEI messages.
4. Remove from outBitstream all SEI NAL units that contain scalable nesting SEI messages with sn_subpic_flag equal to 1 and none of the sn_subpic_id[j] values for j from 0 to sn_num_subpics_minus1, inclusive, is equal to any of the SubpicIdVal[subpicIdxTarget[i]] values for the layers in the multiSubpicLayers.
5. When at least one VCL NAL unit has been removed by step 2, remove from outBitstream all SEI NAL units that contain scalable nesting SEI messages with sn_subpic_flag equal to 0.
6. If some external means not specified in this document is available to provide replacement parameter sets for the sub-bitstream outBitstream, replace all parameter sets with the replacement parameter sets. Otherwise, the following ordered steps apply:
   a. The variable spIdx is set equal to the value of subpicIdxTarget[i] for any layer in the multiSubpicLayers.
   b. When an SLI SEI message that applies to the target OLS is present, set the values of general_level_idc and sublayer_level_idc[k] for k in the range of 0 to tIdTarget−1, inclusive, when present, in the vps_ols_ptl_idx[targetOlsIdx]-th entry in the list of profile_tier_level( ) syntax structures in all the referenced VPSs, and, when NumLayersInOls[targetOlsIdx] is equal to 1, in the profile_tier_level( ) syntax structure in all the referenced SPSs, to be equal to SubpicLevelIdc[spIdx][tIdTarget] and SubpicLevelIdc[spIdx][k], respectively, derived by Equation 1621 for the spIdx-th subpicture sequence.
   c. When an SLI SEI message that applies to the target OLS is present, for k in the range of 0 to tIdTarget, inclusive, let spLvIdx be set equal to SubpicLevelIdx[spIdx][k], where SubpicLevelIdx[spIdx][k] is derived by Equation 1621 for the spIdx-th subpicture sequence. When VCL HRD parameters or NAL HRD parameters are present, for k in the range of 0 to tIdTarget, inclusive, set the respective values of cpb_size_value_minus1[k][j] and bit_rate_value_minus1[k][j] of the j-th CPB, when present, in the vps_ols_timing_hrd_idx[MultiLayerOlsIdx[targetOlsIdx]]-th ols_timing_hrd_parameters( ) syntax structure in all the referenced VPSs and, when NumLayersInOls[targetOlsIdx] is equal to 1, in the ols_timing_hrd_parameters( ) syntax structures in all the referenced SPSs, such that they correspond to SubpicCpbSizeVcl[spLvIdx][spIdx][k], and SubpicCpbSizeNal[spLvIdx][spIdx][k] as derived by Equations 1617 and 1618, respectively, SubpicBitrateVcl[spLvIdx][spIdx][k] and SubpicBitrateNal[spLvIdx][spIdx][k] as derived by Equations 1619 and 1620, respectively, where j is in the range of 0 to hrd_cpb_cnt_minus1, inclusive, and i is in the range of 0 to NumLayersInOls[targetOlsIdx]−1, inclusive.
   d. For each layer in the multiSubpicLayers, the following ordered steps apply for rewriting of the SPSs and PPSs referenced by pictures in that layer:
      i. The variables subpicWidthInLumaSamples and subpicHeightInLumaSamples are derived as follows:

$$\text{subpicWidthInLumaSamples} = \text{Min}((\text{sps\_subpic\_ctu\_top\_left\_}x[\text{spIdx}]+\text{sps\_subpic\_width\_minus1}[\text{spIdx}]+1)*\text{CtbSize}Y, \text{pps\_pic\_width\_in\_luma\_samples}) - \text{sps\_subpic\_ctu\_top\_left\_}x[\text{spIdx}]*\text{CtbSize}Y \quad (1600)$$

$$\text{subpicHeightInLumaSamples} = \text{Min}((\text{sps\_subpic\_ctu\_top\_left\_}y[\text{spIdx}]+\text{sps\_subpic\_height\_minus1}[\text{spIdx}]+1)*\text{CtbSize}Y, \text{pps\_pic\_height\_in\_luma\_samples}) - \text{sps\_subpic\_ctu\_top\_left\_}y[\text{spIdx}]*\text{CtbSize}Y \quad (1601)$$

ii. Set the values of the sps_pic_width_max_in_luma_samples and sps_pic_height_max_in_luma_samples in all the referenced SPSs and the values of pps_pic_width_in_luma_samples and pps_pic_height_in_luma_samples in all the referenced PPSs to be equal to subpicWidthInLumaSamples and subpicHeightInLumaSamples, respectively.
      iii. Set the value of sps_num_subpics_minus1 in all the referenced SPSs and pps_num_subpics_minus1 in all the referenced PPSs to be equal to 0.
      iv. Set the values of the syntax elements sps_subpic_ctu_top_left_x[spIdx] and sps_subpic_ctu_top_left_y[spIdx], when present, in all the referenced SPSs to be equal to 0.
      v. Remove the syntax elements sps_subpic_ctu_top_left_x[j], sps_subpic_ctu_top_left_y[j], sps_subpic_width_minus1[j], sps_subpic_height_minus1[j], sps_subpic_treated_as_pic_flag[j], sps_loop_filter_across_subpic_enabled_flag[j], and sps_subpic_id[j], when present, in all the referenced SPSs for each j not equal to spIdx.
      vi. When spIdx is greater than 0 and sps_subpic_id_mapping_explicitly_signalled_flag of a referenced SPS is equal to 0, set the values of sps_subpic_id_mapping_explicitly_signalled_flag and sps_subpic_id_mapping_present_flag both equal to 1, add sps_subpic_id[0] equal to spIdx into the SPS.
      vii. Remove the syntax elements pps_subpic_id[j], when present, in all the referenced PPSs for each j that is not equal to spIdx.

viii. Set the syntax elements in all the referenced PPSs for signalling of tiles and slices to remove all tile rows, tile columns, and slices that are not associated with the subpicture with subpicture index equal to spIdx.

ix. The variables subpicConfWinLeftOffset, subpicConfWinRightOffset, subpicConfWinTopOffset and subpicConfWinBottomOffset are derived as follows:

subpicConfWinLeftOffset=sps_subpic_ctu_top_left_x
 [spIdx]==0?sps_conf_win_left_offset:0 (1602)

subpicConfWinRightOffset=(sps_subpic_ctu_
 top_left_x[spIdx]+sps_subpic_width_minus1[spIdx]+1)*Ctb
 SizeY>=sps_pic_width_max_in_luma_
 samples?sps_conf_win_right_offset:0 (1603)

subpicConfWinTopOffset=sps_subpic_ctu_top_left_y
 [spIdx]==0?sps_conf_win_top_offset:0 (1604)

subpicConfWinBottomOffset=(sps_subpic_ctu_
 top_left_y[spIdx]+sps_subpic_height_minus1[spIdx]+1)*Ctb
 SizeY>= sps_pic_height_max_in_luma_samp-
 les?sps_conf_win_bottom_offset:0 (1605)

Where the values of sps_subpic_ctu_top_left_x[spIdx], sps_subpic_width_minus1[spIdx], sps_subpic_ctu_top_left_y[spIdx], sps_subpic_height_minus1[spIdx], sps_pic_width_max_in_luma_samples, sps_pic_height_max_in_luma_samples, sps_conf_win_left_offset, sps_conf_win_right_ offset, sps_conf_win_top_offset, and sps_conf_win_bottom_offset in these equations are the values from the original SPSs before they were rewritten.

NOTE 3—For pictures in the layers in the multi-SubpicLayers in both the input bitstream and the output bitstream, the values of sps_pic_width_max_in_luma_samples and sps_pic_height_max_in_luma_samples are equal to pps_pic_width_in_luma_samples and pps_pic_height_in_luma_samples, respectively. Thus in these equations, sps_pic_width_max_in_luma_samples and sps_pic_height_max_in_luma_samples could be replaced with pps_pic_width_in_luma_samples and pps_pic_height_in_luma_samples, respectively.

x. Set the values of sps_conf_win_left_offset, sps_conf_win_right_offset, sps_conf_win_top_offset, and sps_conf_win_bottom_offset in all the referenced SPSs to be equal to subpicConfWinLeftOffset, subpicConfWinRightOffset, subpicConfWinTopOffset, and subpicConfWinBottomOffset, respectively.

xi. The variables subpicScalWinLeftOffset, subpicScalWinRightOffset, subpicScalWinTopOffset and subpicScalWinBotOffset are derived as follows:

subpicScalWinLeftOffset=pps_scaling_win_left_offset−
 sps_subpic_ctu_top_left_x[spIdx]*CtbSizeY/
 SubWidthC (1606)

rightSubpicBd=(sps_subpic_ctu_top_left_x[spIdx]+
 sps_subpic_width_minus1[spIdx]+1)*CtbSizeY subpicScalWinRightOffset=
 (rightSubpicBd>=sps_pic_width_max_in_luma_samples)
 ?pps_scaling_win_right_offset:pps_scaling_win_
 right_offset−(sps_pic_width_max_in_lu-
 ma_samples−rightSubpicBd)/SubWidthC (1607)

subpicScalWinTopOffset=pps_scaling_win_top_offset−
 sps_subpic_ctu_top_left_y[spIdx]*CtbSizeY/
 SubHeightC (1608)

botSubpicBd=(sps_subpic_ctu_top_left_y[spIdx]+
 sps_subpic_height_minus1[spIdx]+1)*CtbSizeY subpicScalWinBotOffset=
 (botSubpicBd>=sps_pic_height_max_in_luma_samples)
 ?pps_scaling_win_bottom_offset:pps_scal-
 ing_win_bottom_offset−
 (sps_pic_height_max_in_luma_samples−
 botSubpicBd)/SubHeightC (1609)

Where the values of sps_subpic_ctu_top_left_x[spIdx], sps_subpic_width_minus1[spIdx], sps_subpic_ctu_top_left_y[spIdx], sps_subpic_height_minus1[spIdx], sps_pic_width_max_in_luma_samples, and sps_pic_height_max_in_luma_samples in these equations are from the original SPSs before they were rewritten, and pps_scaling_win_left_offset, pps_scaling_win_right_offset, pps_scaling_win_top_offset, and pps_scaling_win_bottom_offset in these equations are the values from the original PPSs before they were rewritten.

xii. Set the values of pps_scaling_win_left_offset, pps_scaling_win_right_offset, pps_scaling_win_top_offset, and pps_scaling_win_bottom_offset in all the referenced PPS NAL units to be equal to subpicScalWinLeftOffset, subpicScalWinRightOffset, subpicScalWinTopOffset, and subpicScalWinBotOffset, respectively.

xiii. The variables numVerVbs, subpicVbx[i], numHorVbs, and subpicVby[i] are derived as follows:

```
numVerVbs = 0;
subpicX = sps_subpic_ctu_top_left_x[ spIdx ]
for( i = 0; i < sps_num_ver_virtual_boundaries; i++) {
 vbX = sps_virtual_boundary_pos_x_minus1[ i ] + 1
 if( vbX > ( subpicX * CtbSizeY / 8 ) && vbX <
 Min( ( subpicX +(1610)sps_subpic_width_minus1[ spIdx ] + 1 ) *
 CtbSizeY / 8,
 pps_pic_width_in_luma_samples / 8 ) )
 subpicVbx[ numVerVbs++ ] = vbX − subpicX * CtbSizeY / 8
}
numHorVbs = 0;
subpicY = sps_subpic_ctu_top_left_y[ spIdx ]
for( i = 0; i < sps_num_hor_virtual_boundaries; i++) {
 vbY = sps_virtual_boundary_pos_y_minus1[ i ] + 1
 if( vbY > ( subpicY * CtbSizeY / 8 ) && vbY < Min( ( subpicY +(1611)
 sps_subpic_height_minus1[ spIdx ] + 1 ) * CtbSizeY / 8,
 pps_pic_height_in_luma_samples / 8 ) )
 subpicVby[ numHorVbs++ ] = vbY − subpicY * CtbSizeY / 8
}
```

Where the values of sps_num_ver_virtual_boundaries, sps_virtual_boundary_pos_x_minus1[i], sps_subpic_ctu_top_left_x[spIdx], sps_subpic_width_minus1[spIdx], sps_num_hor_virtual_boundaries, sps_virtual_boundary_pos_y_minus1[i], sps_subpic_ctu_top_left_y[spIdx], and sps_subpic_height_minus1[spIdx] in these equations are the values from the original SPSs before they were rewritten.

xiv. When sps_virtual_boundaries_present_flag is equal to 1, set the values of the sps_num_ver_virtual_boundaries, sps_virtual_boundary_pos_x_minus1[i], sps_num_hor_virtual_boundaries, and sps_virtual_boundary_pos_y_minus1[j] syntax elements in all the reference SPSs to be equal to numVerVbs, subpicVbx[i]−1, numHorVbs, and subpicVby[j]−1, respectively, for i in the range of 0 to numVerVbs−1, inclusive, and j in the range of 0 to numHorVbs−1, inclusive. The virtual boundaries outside the extracted subpicture are removed. When both numVerVbs and numHorVbs are equal to 0, set the value of sps_virtual_boundaries_enabled_flag in all the referenced SPSs to be equal to 0 and remove the syntax elements sps_virtual_boundaries_present_flag, sps_num_ver_virtual_boundaries, sps_virtual_boundary_pos_x_minus1[i], sps_num_hor_virtual_boundaries, and sps_virtual_boundary_pos_y_minus1[i].
  e. When an SLI SEI message that applies to the target OLS is present, the following applies:
    i. If sli_cbr_constraint_flag is equal to 1, set cbr_flag[tIdTarget][j] equal to 1 of the j-th CPB in the vps_ols_timing_hrd_idx[MultiLayerOlsIdx[target OlsIdx]]-th ols_timing_hrd_parameters( ) syntax structure in all the referenced VPSs and, when NumLayersInOls[targetOlsIdx] is equal to 1, in the ols_timing_hrd_parameters( ) syntax structure in all the referenced SPSs.
    ii. Otherwise, (sli_cbr_constraint_flag is equal to 0), set cbr_flag[tIdTarget][j] equal to 0. In both cases, j is in the range of 0 to hrd_cpb_cnt_minus1, inclusive.
7. When at least one VCL NAL unit has been removed by step 2, the following applies in the order listed:
  a. Remove from outBitstream all SEI NAL units that contain a non-scalable-nested SEI message with payloadType equal to 0 (BP), 130 (DUI), 203 (SLI), or 132 (decoded picture hash).
  b. When general_same_pic_timing_in_all_ols_flag is equal to 0, remove from outBitstream all SEI NAL units that contain a non-scalable-nested SEI message with payloadType equal to 1 (PT).
  c. When outBitstream contains an SEI NAL unit seiNalUnitA that contains a scalable nesting SEI message with sn_ols_flag equal to 1 and sn_subpic_flag equal to 1 that applies to the target OLS and the subpictures in outBitstream, or when NumLayersInOls[targetOlsIdx] is equal to 1 and outBitstream contains an SEI NAL unit seiNalUnitA that contains a scalable nesting SEI message with sn_ols_flag is equal to 0 and sn_subpic_flag equal to 1 that applies to the layer and the subpictures in outBitstream, generate a new SEI NAL unit seiNalUnitB, include it in the PU containing seiNalUnitA immediately after seiNalUnitA, extract the scalable-nested SEI messages from the scalable nesting SEI message and include them directly in seiNalUnitB (as non-scalable-nested SEI messages), and remove seiNalUnitA from outBitstream.

4. EXAMPLES OF TECHNICAL PROBLEMS SOLVED BY DISCLOSED TECHNICAL SOLUTIONS

The designs of POC, SEI, and subpicture sub-bitstream extraction in VVC have the following problems:
1) Clause C.4 of the VVC spec includes the following constraint related to POC:
  Let currPicLayerId be equal to the nuh_layer_id of the current picture.
  For each current picture, let the variables maxPicOrderCnt and minPicOrderCnt be set equal to the maximum and the minimum, respectively, of the PicOrderCntVal values of the following pictures with nuh_layer_id equal to currPicLayerId:
    The current picture.
    The previous picture in decoding order that has TemporalId and ph_non_ref_pic_flag both equal to 0 and is not a RASL or RADL picture.
    The short-term reference pictures (STRPs) referred to by all entries in RefPicList[0] and all entries in RefPicList[1] of the current picture.
    All pictures n that have PictureOutputFlag equal to 1, AuCpbRemovalTime[n] less than AuCpbRemovalTime[currPic] and DpbOutputTime[n] greater than or equal to AuCpbRemovalTime[currPic], where currPic is the current picture.
  For each current picture that is not a CLVSS picture, the value of maxPicOrderCnt−minPicOrderCnt shall be less than MaxPicOrderCntLsb/2.
  The above constraint disallows the following bitstreams that would be confirming bitstreams if the second bullet item above is relaxed:
  a. An original bitstream is a single-layer bitstream, and a sub-bitstream outBitstream is extracted out of the bitstream by removing all the non-intra-coded pictures. There is at least one picture picA in outBitstream such that the difference of the POC values between the picture picA and the picture prevTid0Pic, i.e., the previous picture in decoding order in the same layer that has TemporalId and ph_non_ref_pic_flag both equal to 0 and is not a RASL or RADL picture, is greater than MaxPicOrderCntLsb/2. According to the above constraint, this bitstream outBitstream is then not a conforming bitstream, as it violates the constraint.
  However, if picA has the POC MSB value signalled in the PH, then its POC can be correctly derived. Therefore, it the second bullet item is changed to be as follows, the bitstream outBitstream may become a conforming bitstream:
    When ph_poc_msb_cycle_val is not present for the current picture, the previous picture in decoding order that has TemporalId and ph_non_ref_pic_flag both equal to 0 and is not a RASL or RADL picture.
  b. An original bitstream is a multi-layer bitstream, a layer with layer index j is a direct reference layer of another layer with layer index layerB in the bitstream, and vps_max_tid_il_ref_pics_plus1[i][j] is equal to 0. Then in the extracted bitstream outBitstream, per the general sub-bitstream extraction process, for an OLS for which layer j is an output layer while layer i is not, there are only GDR picture with ph_recovery_poc_cnt equal to 0 or IRAP pictures in layer i. In this case, similarly as above, if there is at least one picture picA in layer i in outBitstream such that the difference of the POC values between the picture picA and the picture prevTid0Pic, i.e., the previous picture in decoding order in the same layer that has TemporalId and ph_non_ref_pic_flag both equal to 0 and is not a RASL or RADL picture, is greater than MaxPicOrderCntLsb/2. According to the above constraint, this bitstream outBitstream is then not a conforming bistream, as it violates the constraint. Since such an extracted bitstream like outBitstream is required to be a conforming bitstream if the origina bistream was a conforming bitstream, consequently, the original bitsream is not a confirming bitstream, either.
  However, if picA has the POC MSB value signalled in the PH, then its POC can be correctly derived. Again, if the second bullet item above is changed to be as follows, both the bitstream outBitstream and the original bitstream in this example may become a conforming bitstream:

When ph_poc_msb_cycle_val is not present for the current picture, the previous picture in decoding order that has TemporalId and ph_non_ref_pic_flag both equal to 0 and is not a RASL or RADL picture.

c. Similar original bitstream and outBitstream as in examples a and b above, but containing multiple layers, and for the picture picA, there is another picture picB in the same AU and that picture belongs to a reference layer of the layer containing picA. In other words, the POC value of picA would be derived to be equal to the POC value of picB. In this case, even the picture POC difference between picA and the prevTid0Pic is greater than MaxPicOrderCntLsb/2, the POC value of picA can still be correctly derived, as long as the POC value of picB can be correctly derived.

Therefore, if the second bullet item above is changed to be as follows, the bitstream outBitstream in such an example may become a conforming bitstream:

When in the current AU there is no picture belonging to a reference layer of the current layer, the previous picture in decoding order that has TemporalId and ph_non_ref_pic_flag both equal to 0 and is not a RASL or RADL picture.

2) In the general sub-bitstream extraction process, the step 9 removes from outBitstream all SEI NAL units that contain a scalable nesting SEI message that has sn_ols_flag equal to 0 and there is no value in the list NestingLayerId equal to a value in the list LayerIdInOls[targetOlsIdx]. However, this step is actually not needed, because: 1) For an SEI NAL unit containing a scalable nesting SEI message with sn_ols_flag equal to 0, NestingLayerId would always include the layer ID of the SEI NAL unit. 2) If an SEI NAL unit has layer ID not in the list LayerIdInOls[targetOlsIdx], it would have been removed already by step 3.

3) In the subpicture sub-bitstream extraction process, when at least one VCL NAL unit has been removed by the step 2, the step 5 removes from outBitstream all SEI NAL units that contain scalable nesting SEI messages with sn_subpic_flag equal to 0, including nested SLI SEI messages. However, nested SLI SEI messages, when present, may be needed by the step 6 for parameter sets rewriting.

4) It is allowed that both nested and non-nested HRD-related SEI messages are present and apply to the same OLS. Similarly, it is also allowed that both nested and non-nested non-HRD-related SEI messages are present and apply to the same layer. However, there lacks a constraint to require that the content of such SEI messages of a particular payload type to be the same.

5. EXAMPLES OF TECHNICAL SOLUTIONS

To solve the above problems, and others, methods as summarized below are disclosed. The items should be considered as examples to explain the general concepts and should not be interpreted in a narrow way. Furthermore, these items can be applied individually or combined in any manner.

1) To solve problem 1, it is proposed that the second bullet item in the POC related constraint as described in problem 1 is changed to be one of the following:

a. When ph_poc_msb_cycle_val is not present for the current picture and in the current AU there is no picture belonging to a reference layer of the current layer, the previous picture in decoding order that has TemporalId and ph_non_ref_pic_flag both equal to 0 and is not a RASL or RADL picture.

i. Alternatively, the phrase "in the current AU there is no picture belonging to a reference layer of the current layer" is replaced by "PocFromIlrpFlag of the current picture is equal to 0", and PocFromIlrpFlag is specified as follows:

Let the variable currLayerIdx be set equal to GeneralLayerIdx[nuh_layer_id]. If vps_independent_layer_flag[currLayerIdx] is equal to 0 and there is a picture picA in the current AU with nuh_layer_id equal to layerIdA such that GeneralLayerIdx[layerIdA] is in the list ReferenceLayerIdx[currLayerIdx], the variable PocFromIlrpFlag is set equal to 1. Otherwise, PocFromIlrpFlag is set equal qual to 0.

b. When ph_poc_msb_cycle_val is not present for the current picture, the previous picture in decoding order that has TemporalId and ph_non_ref_pic_flag both equal to 0 and is not a RASL or RADL picture.

c. When in the current AU there is no picture belonging to a reference layer of the current layer, the previous picture in decoding order that has TemporalId and ph_non_ref_pic_flag both equal to 0 and is not a RASL or RADL picture.

i. Alternatively, the phrase "in the current AU there is no picture belonging to a reference layer of the current layer" is replaced by "PocFromIlrpFlag of the current picture is equal to 0", and PocFromIlrpFlag is specified as above.

d. When ph_poc_msb_cycle_val is not present for the current picture or in the current AU there is no picture belonging to a reference layer of the current layer, the previous picture in decoding order that has TemporalId and ph_non_ref_pic_flag both equal to 0 and is not a RASL or RADL picture.

i. Alternatively, the phrase "in the current AU there is no picture belonging to a reference layer of the current layer" is replaced by "PocFromIlrpFlag of the current picture is equal to 0", and PocFromIlrpFlag is specified as above.

2) To solve problem 2, remove the step 9 of the general sub-bitstream extraction process.

3) To solve problem 3, the step 5 of the subpicture sub-bitstream extraction process is moved after the entire step 6.

4) To solve problem 4, the following constraint is proposed: When there are multiple SEI messages with a particular value of payloadType not equal to 133 that are associated with a particular AU or DU and apply to a particular OLS or layer, regardless of whether some or all of these SEI messages are scalable-nested, the SEI messages shall have the same SEI payload content.

Note that an SEI message with payloadType equal to 133 is a scalable nesting SEI message.

6. EMBODIMENTS

Below are some example embodiments for some of the invention aspects summarized above in Section 5, which can be applied to the VVC specification. The changed texts are based on the latest VVC text in JVET-S2001-vH. Most relevant parts that have been added or modified are shown in bold, italicized and underlined fonts, e.g., feature indicates an addition, and some of the deleted parts are enclosed in bolded, italicized double brackets, e.g., [[feature]] indicates a deletion. There may be some other changes that are editorial in nature and thus not highlighted.

6.1. First Embodiment

This embodiment is for items 1.a.i, 2, 3, and 4.

8.3.1 Decoding Process for Picture Order Count

Output of this process is PicOrderCntVal, the picture order count of the current picture.
Each coded picture is associated with a picture order count variable, denoted as PicOrderCntVal.
Let the variable currLayerIdx be set equal to GeneralLayerIdx[nuh_layer_id].
PicOrderCntVal is derived as follows:
  If vps_independent_layer_flag[currLayerIdx] is equal to 0 and there is a picture picA in the current AU with nuh_layer_id equal to layerIdA such that GeneralLayerIdx[layerIdA] is in the list ReferenceLayerIdx[currLayerIdx], PicOrderCntVal is derived to be equal to the PicOrderCntVal of picA, the variable PocFromIlrpFlag is set equal qual to 1, and the value of ph_pic_order_cnt_lsb shall be the same in all VCL NAL units of the current AU.
  Otherwise, PocFromIlrpFlag is set equal qual to 0, and PicOrderCntVal of the current picture is derived as specified in the remainder of this subclause.
When ph_poc_msb_cycle_val is not present and the current picture is not a CLVSS picture, the variables prevPicOrderCntLsb and prevPicOrderCntMsb are derived as follows:
  Let prevTid0Pic be the previous picture in decoding order that has nuh_layer_id equal to the nuh_layer_id of the current picture, has TemporalId and ph_non_ref_pic_flag both equal to 0, and is not a RASL or RADL picture.
    NOTE 1—In a sub-bitstream consisting of only intra pictures, extracted from a single-layer bitstream and used in intra-picture-only trick play, the prevTid0Pic is the previous intra picture in decoding order that has TemporalId equal to 0. To ensure correct POC derivation, encoders could choose either to include ph_poc_msb_cycle_val for each intra picture, or set the value of sps_log2_max_pic_order_cnt_lsb_minus4 to be large enough such that the POC difference between the current picture and the prevTid0Pic is less than MaxPicOrderCntLsb/2.
    NOTE 2—When vps_max_tid_il_ref_pics_plus1[i][j] is equal to 0 for any value of i among the layer indices and j equal to the layer index of the current layer, the prevTid0Pic in the extracted sub-bitstream for some of the OLSs would be the previous IRAP or GDR picture with ph_recovery_poc_cnt equal to 0 in the current layer in decoding order. To ensure such a sub-bitstream to be a conforming bitstream, encoders could choose either to include ph_poc_msb_cycle_val for each IRAP or GDR picture with ph_recovery_poc_cnt equal to 0, or set the value of sps_log2_max_pic_order_cnt_lsb_minus4 to be large enough such that the POC difference between the current picture and the prevTid0Pic is less than MaxPicOrderCntLsb/2.
  The variable prevPicOrderCntLsb is set equal to ph_pic_order_cnt_lsb of prevTid0Pic.
  The variable prevPicOrderCntMsb is set equal to PicOrderCntMsb of prevTid0Pic.

C.4 Bitstream Conformance

A bitstream of coded data conforming to this Specification shall fulfil all requirements specified in this subclause.
The bitstream shall be constructed according to the syntax, semantics and constraints specified in this Specification outside of this annex.
The first coded picture in a bitstream shall be an IRAP picture (i.e., an IDR picture or a clean random access (CRA) picture) or a GDR picture.
The bitstream is tested by the HRD for conformance as specified in subclause C.1.
Let currPicLayerId be equal to the nuh_layer_id of the current picture.
For each current picture, let the variables maxPicOrderCnt and minPicOrderCnt be set equal to the maximum and the minimum, respectively, of the PicOrderCntVal values of the following pictures with nuh_layer_id equal to currPicLayerId:
  The current picture.
    When ph_poc_msb_cycle_val is not present for the current picture and PocFromIlrpFlag of the current picture is equal to 0, the previous picture in decoding order that has TemporalId and ph_non_ref_pic_flag both equal to 0 and is not a RASL or RADL picture.
    The STRPs referred to by all entries in RefPicList[0] and all entries in RefPicList[1] of the current picture.
    All pictures n that have PictureOutputFlag equal to 1, AuCpbRemovalTime[n] less than AuCpbRemovalTime[currPic] and DpbOutputTime[n] greater than or equal to AuCpbRemovalTime[currPic], where currPic is the current picture.
All of the following conditions shall be fulfilled for each of the bitstream conformance tests:
  8. For each current picture that is not a CLVSS picture, the value of maxPicOrderCnt−minPicOrderCnt shall be less than MaxPicOrderCntLsb/2.

C.6 General Sub-Bitstream Extraction Process

The output sub-bitstream OutBitstream is derived by applying the following ordered steps:
1. The bitstream outBitstream is set to be identical to the bitstream inBitstream.
2. Remove from outBitstream all NAL units with TemporalId greater than tIdTarget.
3. Remove from outBitstream all NAL units that have nuh_layer_id not included in the list LayerIdInOls[targetOlsIdx], and are not DCI, OPI, VPS, AUD, or EOB NAL units, and are not SEI NAL units containing non-scalable-nested SEI messages with payload PayloadType equal to 0, 1, 130, or 203.
4. Remove from outBitstream all APS and VCL NAL units for which all of the following conditions are true, and the associated non-VCL NAL units of these VCL NAL units with nal_unit_type equal to PH_NUT or FD_NUT, or with nal_unit_type equal to SUFFIX_SEI_NUT or PREFIX_SEI_NUT and containing SEI messages with PayloadType not equal to any of 0 (BP), 1 (PT), 130 (DUI), and 203 (SLI):
  nal_unit_type is equal to APS_NUT, TRAIL_NUT, STSA_NUT, RADL_NUT, or RASL_NUT, or nal_unit_type is equal to GDR_NUT and the associated ph_recovery_poc_cnt is greater than 0.
  TemporalId is greater than or equal to NumSubLayersInLayerInOLS[targetOlsIdx][GeneralLayerIdx[nuh_layer_id]].

5. When all VCL NAL units of an AU are removed by steps 2, 3, or 4 above and an AUD or OPI NAL unit is present in the AU, remove the AUD or OPI NAL unit from outBitstream.
6. For each OPI NAL unit in outBitstream, set opi_htid_info_present_flag equal to 1, set opi_ols_info_present_flag equal to 1, set opi_htid_plus1 equal to tIdTarget+1, and set opi_ols_idx equal to targetOlsIdx.
7. When an AUD is present in an AU in outBitstream and the AU becomes an IRAP or GDR AU, set aud_irap_or_gdr_flag of the AUD equal to 1.
8. Remove from outBitstream all SEI NAL units that contain a scalable nesting SEI message that has sn_ols_flag equal to 1 and there is no value of i in the range of 0 to sn_num_olss_minus1, inclusive, such that NestingOlsIdx [i] is equal to targetOlsIdx.
9. When LayerIdInOls[targetOlsIdx] does not include all values of nuh_layer_id in all VCL NAL units in the bitstream inBitstream, the following applies in the order listed:
. . . .

C.7 Subpicture Sub-Bitstream Extraction Process
. . . .
The output sub-bitstream outBitstream is derived by the following order steps:
1. The sub-bitstream extraction process, specified in Annex C.6, is invoked with inBitstream, targetOlsIdx, and tIdTarget as inputs and the output of the process is assigned to outBitstream.
2. For each value of i in the range of 0 to NumLayersInOls [targetOlsIdx]−1, inclusive, remove from outBitstream all VCL NAL units with nuh_layer_id equal to LayerIdInOls [targetOlsIdx][i] and sh_subpic_id not equal to SubpicIdVal[subpicIdxTarget[i]], their associated filler data NAL units, and their associated SEI NAL units that contain filler payload SEI messages.
3. When an SLI SEI message that applies to the target OLS is present and sli_cbr_constraint_flag of the SLI SEI message is equal to 0, remove all NAL units with nal_unit_type equal to FD_NUT and SEI NAL units containing filler payload SEI messages.
4. Remove from outBitstream all SEI NAL units that contain scalable nesting SEI messages with sn_subpic_flag equal to 1 and none of the sn_subpic_id[j] values for j from 0 to sn_num_subpics_minus1, inclusive, is equal to any of the SubpicIdVal[subpicIdxTarget[i]] values for the layers in the multiSubpicLayers.
5. If some external means not specified in this document is available to provide replacement parameter sets for the sub-bitstream outBitstream, replace all parameter sets with the replacement parameter sets. Otherwise, the following ordered steps apply:
. . . .
6. When at least one VCL NAL unit has been removed by step 2, remove from outBitstream all SEI NAL units that contain scalable nesting SEI messages with sn_subpic_flag equal to 0.
7. When at least one VCL NAL unit has been removed by step 2, the following applies in the order listed:
. . . .

Figure 4:
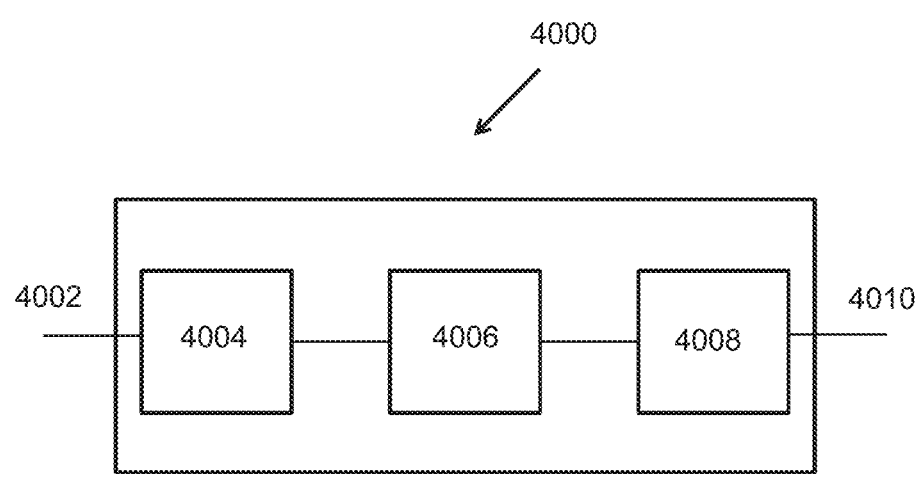
FIG. 4 is a block diagram of an example video processing system.

FIG. 4 is a block diagram showing an example video processing system 4000 in which various techniques disclosed herein may be implemented. Various implementations may include some or all of the components of the system 4000. The system 4000 may include input 4002 for receiving video content. The video content may be received in a raw or uncompressed format, e.g., 8 or 10 bit multi-component pixel values, or may be in a compressed or encoded format. The input 4002 may represent a network interface, a peripheral bus interface, or a storage interface. Examples of network interface include wired interfaces such as Ethernet, passive optical network (PON), etc. and wireless interfaces such as Wi-Fi or cellular interfaces.

The system 4000 may include a coding component 4004 that may implement the various coding or encoding methods described in the present document. The coding component 4004 may reduce the average bitrate of video from the input 4002 to the output of the coding component 4004 to produce a coded representation of the video. The coding techniques are therefore sometimes called video compression or video transcoding techniques. The output of the coding component 4004 may be either stored, or transmitted via a communication connected, as represented by the component 4006. The stored or communicated bitstream (or coded) representation of the video received at the input 4002 may be used by the component 4008 for generating pixel values or displayable video that is sent to a display interface 4010. The process of generating user-viewable video from the bitstream representation is sometimes called video decompression. Furthermore, while certain video processing operations are referred to as "coding" operations or tools, it will be appreciated that the coding tools or operations are used at an encoder and corresponding decoding tools or operations that reverse the results of the coding will be performed by a decoder.

Examples of a peripheral bus interface or a display interface may include universal serial bus (USB) or high definition multimedia interface (HDMI) or Displayport, and so on. Examples of storage interfaces include serial advanced technology attachment (SATA), peripheral component interconnect (PCI), integrated drive electronics (IDE) interface, and the like. The techniques described in the present document may be embodied in various electronic devices such as mobile phones, laptops, smartphones or other devices that are capable of performing digital data processing and/or video display.

Figure 5:
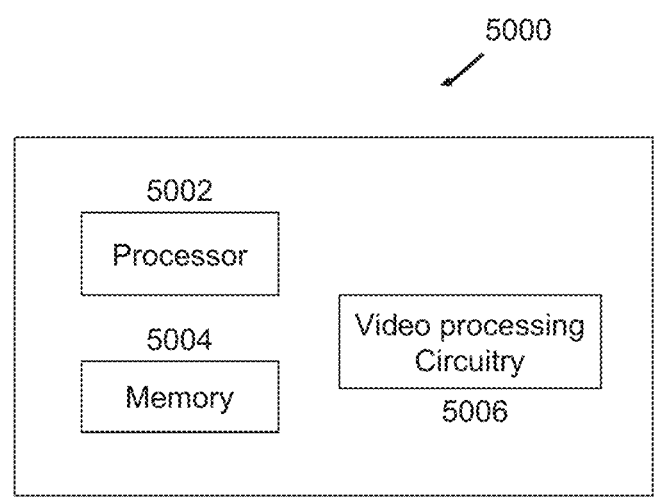
FIG. 5 is a block diagram of a video processing apparatus.

FIG. 5 is a block diagram of a video processing apparatus 5000. The apparatus 5000 may be used to implement one or more of the methods described herein (e.g., method shown in FIGS. 9-11). The apparatus 5000 may be embodied in a smartphone, tablet, computer, Internet of Things (IoT) receiver, and so on. The apparatus 5000 may include one or more processors 5002, one or more memories 5004 and video processing hardware 5006. The processor(s) 5002 may be configured to implement one or more methods described in the present document. The memory (memories) 5004 may be used for storing data and code used for implementing the methods and techniques described herein. The video processing hardware 5006 may be used to implement, in hardware circuitry, some techniques described in the present document. In some embodiments, the video processing hardware 5006 may be at least partly included in the processor 5002, e.g., a graphics co-processor.

Figure 6:
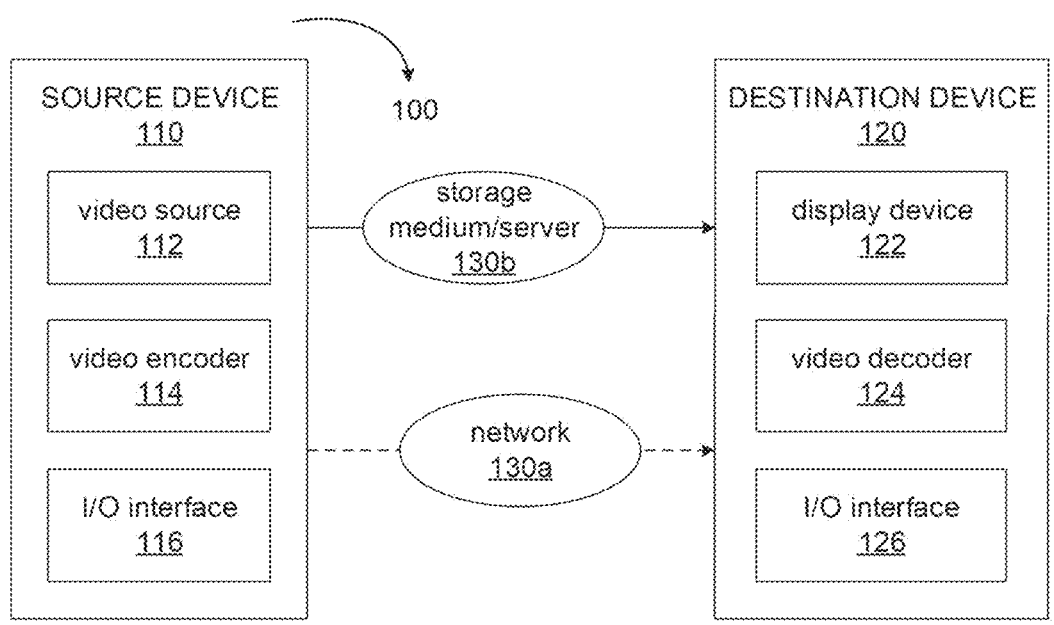
FIG. 6 is a block diagram that illustrates a video coding system in accordance with some embodiments of the present disclosure.

FIG. 6 is a block diagram that illustrates an example video coding system 100 that may utilize the techniques of this disclosure.

As shown in FIG. 6, video coding system 100 may include a source device 110 and a destination device 120. Source device 110 generates encoded video data which may be referred to as a video encoding device. Destination device 120 may decode the encoded video data generated by source device 110 which may be referred to as a video decoding device.

Source device 110 may include a video source 112, a video encoder 114, and an input/output (I/O) interface 116.

Video source 112 may include a source such as a video capture device, an interface to receive video data from a video content provider, and/or a computer graphics system for generating video data, or a combination of such sources. The video data may comprise one or more pictures. Video encoder 114 encodes the video data from video source 112 to generate a bitstream. The bitstream may include a sequence of bits that form a coded representation of the video data. The bitstream may include coded pictures and associated data. The coded picture is a coded representation of a picture. The associated data may include sequence parameter sets, picture parameter sets, and other syntax structures. I/O interface 116 may include a modulator/demodulator (modem) and/or a transmitter. The encoded video data may be transmitted directly to destination device 120 via I/O interface 116 through network 130a. The encoded video data may also be stored onto a storage medium/server 130b for access by destination device 120.

Destination device 120 may include an I/O interface 126, a video decoder 124, and a display device 122.

I/O interface 126 may include a receiver and/or a modem. I/O interface 126 may acquire encoded video data from the source device 110 or the storage medium/server 130b. Video decoder 124 may decode the encoded video data. Display device 122 may display the decoded video data to a user. Display device 122 may be integrated with the destination device 120, or may be external to destination device 120 which be configured to interface with an external display device.

Video encoder 114 and video decoder 124 may operate according to a video compression standard, such as the High Efficiency Video Coding (HEVC) standard, Versatile Video Coding (VVM) standard and other current and/or further standards.

Figure 7:
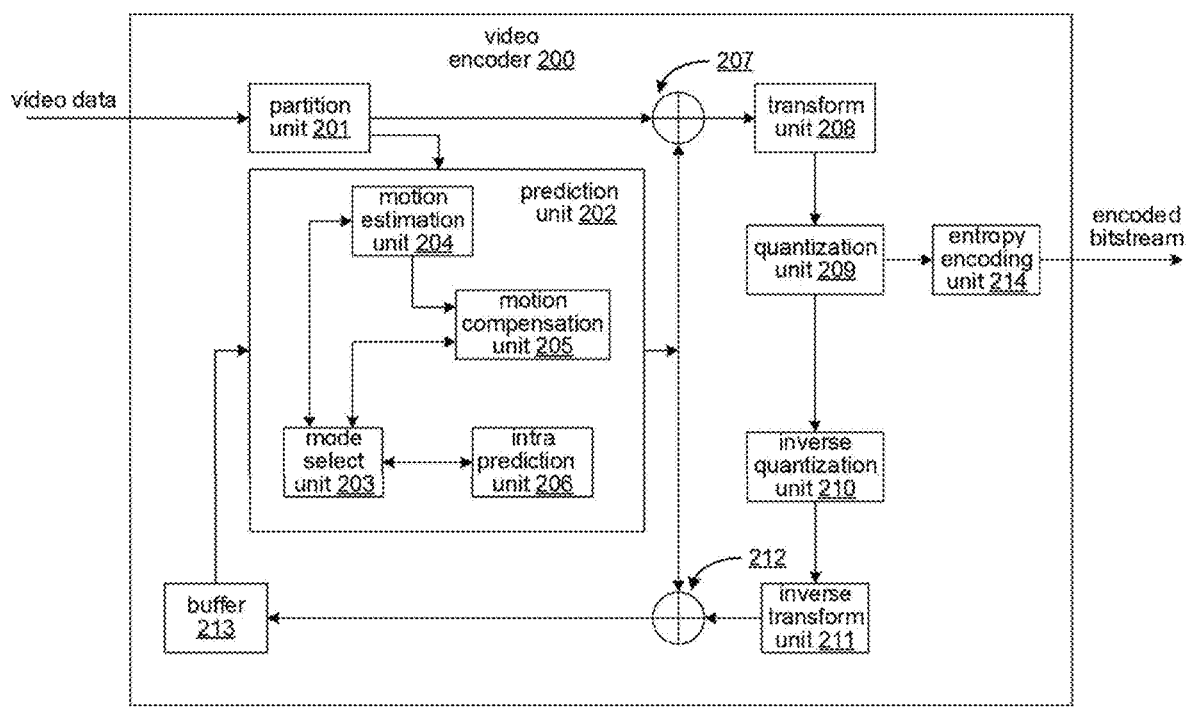
FIG. 7 is a block diagram that illustrates an encoder, in accordance with some embodiments of the disclosed technology.

FIG. 7 is a block diagram illustrating an example of video encoder 200, which may be video encoder 114 in the system 100 illustrated in FIG. 6.

Video encoder 200 may be configured to perform any or all of the techniques of this disclosure. In the example of FIG. 7, video encoder 200 includes a plurality of functional components. The techniques described in this disclosure may be shared among the various components of video encoder 200. In some examples, a processor may be configured to perform any or all of the techniques described in this disclosure.

The functional components of video encoder 200 may include a partition unit 201, a prediction unit 202 which may include a mode select unit 203, a motion estimation unit 204, a motion compensation unit 205 and an intra prediction unit 206, a residual generation unit 207, a transform unit 208, a quantization unit 209, an inverse quantization unit 210, an inverse transform unit 211, a reconstruction unit 212, a buffer 213, and an entropy encoding unit 214.

In other examples, video encoder 200 may include more, fewer, or different functional components. In an example, prediction unit 202 may include an intra block copy (IBC) unit. The IBC unit may perform prediction in an IBC mode in which at least one reference picture is a picture where the current video block is located.

Furthermore, some components, such as motion estimation unit 204 and motion compensation unit 205 may be highly integrated, but are represented in the example of FIG. 7 separately for purposes of explanation.

Partition unit 201 may partition a picture into one or more video blocks. Video encoder 200 and video decoder 300 may support various video block sizes.

Mode select unit 203 may select one of the coding modes, intra or inter, e.g., based on error results, and provide the resulting intra- or inter-coded block to a residual generation unit 207 to generate residual block data and to a reconstruction unit 212 to reconstruct the encoded block for use as a reference picture. In some examples, mode select unit 203 may select a combination of intra and inter prediction (CIIP) mode in which the prediction is based on an inter prediction signal and an intra prediction signal. Mode select unit 203 may also select a resolution for a motion vector (e.g., a sub-pixel or integer pixel precision) for the block in the case of inter-prediction.

To perform inter prediction on a current video block, motion estimation unit 204 may generate motion information for the current video block by comparing one or more reference frames from buffer 213 to the current video block. Motion compensation unit 205 may determine a predicted video block for the current video block based on the motion information and decoded samples of pictures from buffer 213 other than the picture associated with the current video block.

Motion estimation unit 204 and motion compensation unit 205 may perform different operations for a current video block, for example, depending on whether the current video block is in an I slice, a P slice, or a B slice.

In some examples, motion estimation unit 204 may perform uni-directional prediction for the current video block, and motion estimation unit 204 may search reference pictures of list 0 or list 1 for a reference video block for the current video block. Motion estimation unit 204 may then generate a reference index that indicates the reference picture in list 0 or list 1 that contains the reference video block and a motion vector that indicates a spatial displacement between the current video block and the reference video block. Motion estimation unit 204 may output the reference index, a prediction direction indicator, and the motion vector as the motion information of the current video block. Motion compensation unit 205 may generate the predicted video block of the current block based on the reference video block indicated by the motion information of the current video block.

In other examples, motion estimation unit 204 may perform bi-directional prediction for the current video block, motion estimation unit 204 may search the reference pictures in list 0 for a reference video block for the current video block and may also search the reference pictures in list 1 for another reference video block for the current video block. Motion estimation unit 204 may then generate reference indexes that indicate the reference pictures in list 0 and list 1 containing the reference video blocks and motion vectors that indicate spatial displacements between the reference video blocks and the current video block. Motion estimation unit 204 may output the reference indexes and the motion vectors of the current video block as the motion information of the current video block. Motion compensation unit 205 may generate the predicted video block of the current video block based on the reference video blocks indicated by the motion information of the current video block.

In some examples, motion estimation unit 204 may output a full set of motion information for decoding processing of a decoder.

In some examples, motion estimation unit 204 may do not output a full set of motion information for the current video.

Rather, motion estimation unit 204 may signal the motion information of the current video block with reference to the motion information of another video block. For example, motion estimation unit 204 may determine that the motion information of the current video block is sufficiently similar to the motion information of a neighboring video block.

In one example, motion estimation unit 204 may indicate, in a syntax structure associated with the current video block, a value that indicates to the video decoder 300 that the current video block has the same motion information as another video block.

In another example, motion estimation unit 204 may identify, in a syntax structure associated with the current video block, another video block and a motion vector difference (MVD). The motion vector difference indicates a difference between the motion vector of the current video block and the motion vector of the indicated video block. The video decoder 300 may use the motion vector of the indicated video block and the motion vector difference to determine the motion vector of the current video block.

As discussed above, video encoder 200 may predictively signal the motion vector. Two examples of predictive signaling techniques that may be implemented by video encoder 200 include advanced motion vector prediction (AMVP) and merge mode signaling.

Intra prediction unit 206 may perform intra prediction on the current video block. When intra prediction unit 206 performs intra prediction on the current video block, intra prediction unit 206 may generate prediction data for the current video block based on decoded samples of other video blocks in the same picture. The prediction data for the current video block may include a predicted video block and various syntax elements.

Residual generation unit 207 may generate residual data for the current video block by subtracting (e.g., indicated by the minus sign) the predicted video block(s) of the current video block from the current video block. The residual data of the current video block may include residual video blocks that correspond to different sample components of the samples in the current video block.

In other examples, there may be no residual data for the current video block for the current video block, for example in a skip mode, and residual generation unit 207 may not perform the subtracting operation.

Transform processing unit 208 may generate one or more transform coefficient video blocks for the current video block by applying one or more transforms to a residual video block associated with the current video block.

After transform processing unit 208 generates a transform coefficient video block associated with the current video block, quantization unit 209 may quantize the transform coefficient video block associated with the current video block based on one or more quantization parameter (QP) values associated with the current video block.

Inverse quantization unit 210 and inverse transform unit 211 may apply inverse quantization and inverse transforms to the transform coefficient video block, respectively, to reconstruct a residual video block from the transform coefficient video block. Reconstruction unit 212 may add the reconstructed residual video block to corresponding samples from one or more predicted video blocks generated by the prediction unit 202 to produce a reconstructed video block associated with the current block for storage in the buffer 213.

After reconstruction unit 212 reconstructs the video block, loop filtering operation may be performed reduce video blocking artifacts in the video block.

Entropy encoding unit 214 may receive data from other functional components of the video encoder 200. When entropy encoding unit 214 receives the data, entropy encoding unit 214 may perform one or more entropy encoding operations to generate entropy encoded data and output a bitstream that includes the entropy encoded data.

Figure 8:
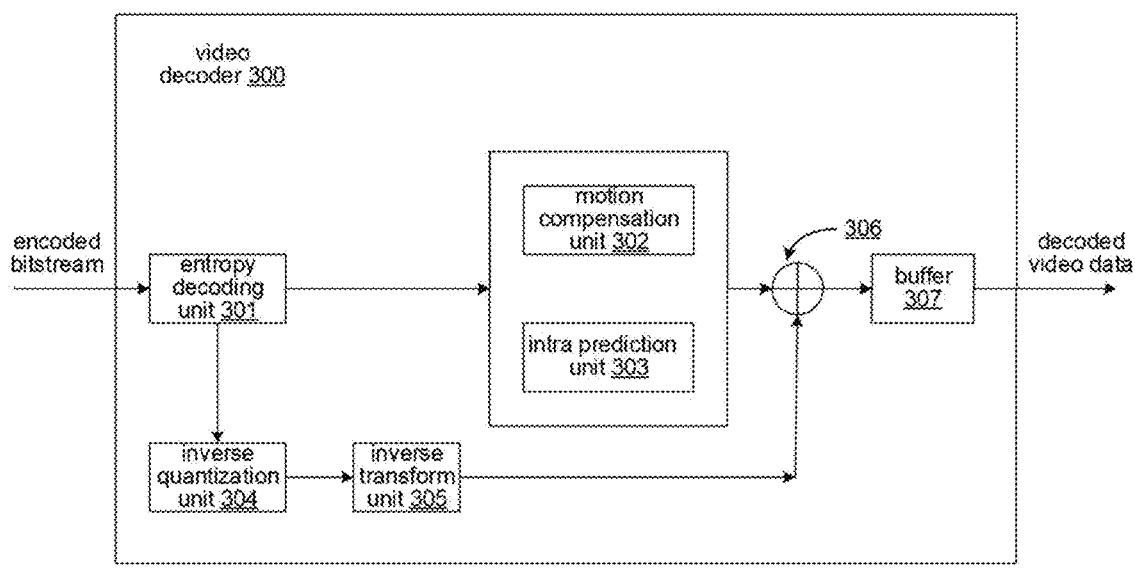
FIG. 8 is a block diagram that illustrates a decoder, in accordance with some embodiments of the disclosed technology.

FIG. 8 is a block diagram illustrating an example of video decoder 300 which may be video decoder 124 in the system 100 illustrated in FIG. 6.

The video decoder 300 may be configured to perform any or all of the techniques of this disclosure. In the example of FIG. 8, the video decoder 300 includes a plurality of functional components. The techniques described in this disclosure may be shared among the various components of the video decoder 300. In some examples, a processor may be configured to perform any or all of the techniques described in this disclosure.

In the example of FIG. 8, video decoder 300 includes an entropy decoding unit 301, a motion compensation unit 302, an intra prediction unit 303, an inverse quantization unit 304, an inverse transformation unit 305, and a reconstruction unit 306 and a buffer 307. Video decoder 300 may, in some examples, perform a decoding pass generally reciprocal to the encoding pass described with respect to video encoder 200 (FIG. 7).

Entropy decoding unit 301 may retrieve an encoded bitstream. The encoded bitstream may include entropy coded video data (e.g., encoded blocks of video data). Entropy decoding unit 301 may decode the entropy coded video data, and from the entropy decoded video data, motion compensation unit 302 may determine motion information including motion vectors, motion vector precision, reference picture list indexes, and other motion information. Motion compensation unit 302 may, for example, determine such information by performing the AMVP and merge mode.

Motion compensation unit 302 may produce motion compensated blocks, possibly performing interpolation based on interpolation filters. Identifiers for interpolation filters to be used with sub-pixel precision may be included in the syntax elements.

Motion compensation unit 302 may use interpolation filters as used by video encoder 200 during encoding of the video block to calculate interpolated values for sub-integer pixels of a reference block. Motion compensation unit 302 may determine the interpolation filters used by video encoder 200 according to received syntax information and use the interpolation filters to produce predictive blocks.

Motion compensation unit 302 may use some of the syntax information to determine sizes of blocks used to encode frame(s) and/or slice(s) of the encoded video sequence, partition information that describes how each macroblock of a picture of the encoded video sequence is partitioned, modes indicating how each partition is encoded, one or more reference frames (and reference frame lists) for each inter-encoded block, and other information to decode the encoded video sequence.

Intra prediction unit 303 may use intra prediction modes for example received in the bitstream to form a prediction block from spatially adjacent blocks. Inverse quantization unit 304 inverse quantizes, i.e., de-quantizes, the quantized video block coefficients provided in the bitstream and decoded by entropy decoding unit 301. Inverse transform unit 305 applies an inverse transform.

Reconstruction unit 306 may sum the residual blocks with the corresponding prediction blocks generated by motion compensation unit 302 or intra-prediction unit 303 to form decoded blocks. If desired, a deblocking filter may also be applied to filter the decoded blocks in order to remove blockiness artifacts. The decoded video blocks are then stored in buffer 307, which provides reference blocks for subsequent motion compensation/intra prediction and also produces decoded video for presentation on a display device.

Figure 9:
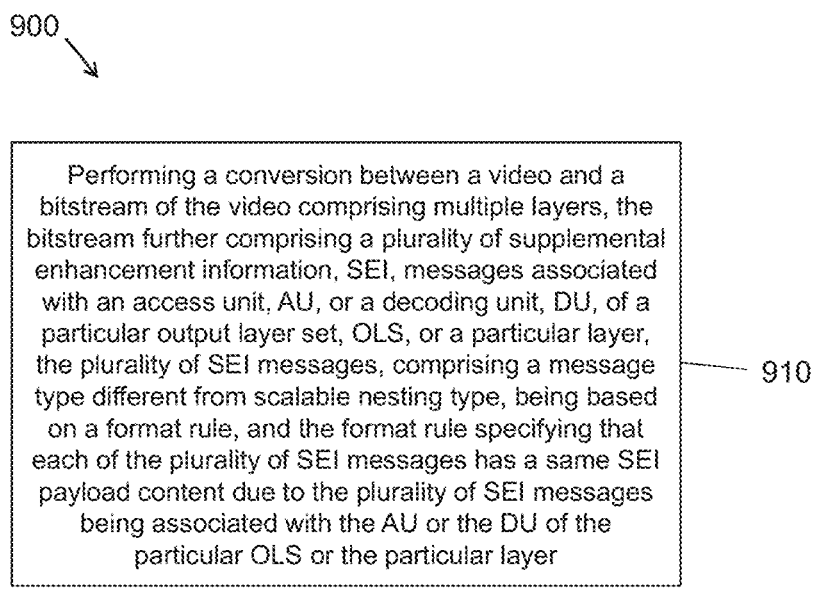
FIG. 9-11 are flowcharts for example methods of video processing, in accordance with some embodiments of the disclosed technology.
Figure 10:
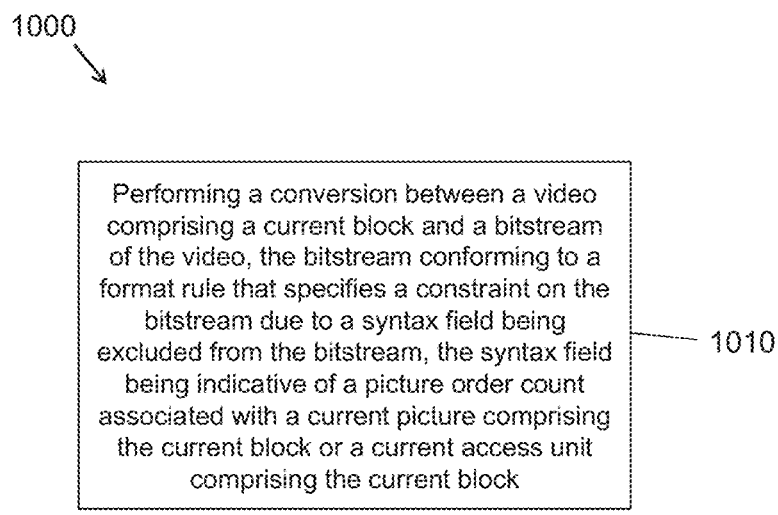
Figure 11:
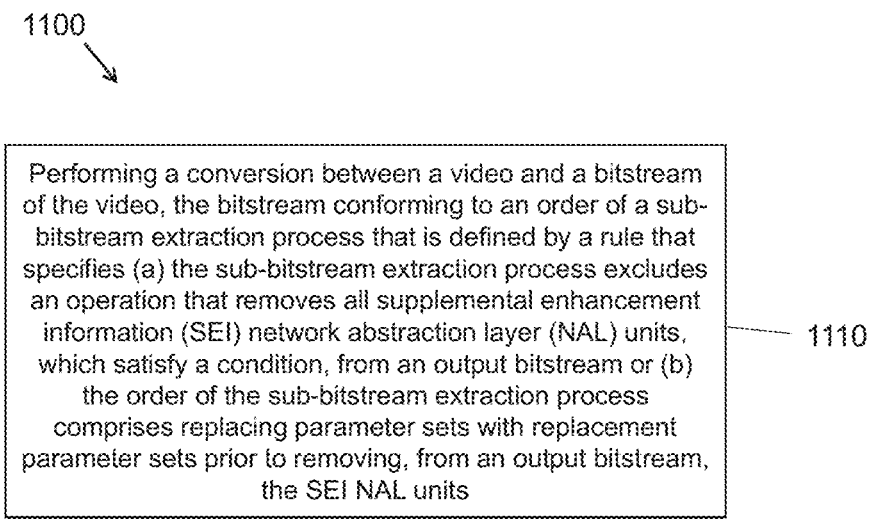

FIGS. 9-11 show example methods that can implement the technical solution described above in, for example, the embodiments shows in FIGS. 4-8.

FIG. 9 shows a flowchart for an example method 900 of video processing. The method 900 includes, at operation 910, performing a conversion between a video and a bitstream of the video comprising multiple layers, the bitstream further comprising a plurality of supplemental enhancement information, SEI, messages associated with an access unit, AU, or a decoding unit, DU, of a particular output layer set, OLS, or a particular layer, the plurality of SEI messages, comprising a message type different from scalable nesting type, being based on a format rule, and the format rule specifying that each of the plurality of SEI messages has a same SEI payload content due to the plurality of SEI messages being associated with the AU or the DU of the particular OLS or the particular layer.

FIG. 10 shows a flowchart for an example method 1000 of video processing. The method 1000 includes, at operation 1010, performing a conversion between a video comprising a current block and a bitstream of the video, the bitstream conforming to a format rule that specifies a constraint on the bitstream due to a syntax field being excluded from the bitstream, the syntax field being indicative of a picture order count (POC) associated with a current picture comprising the current block or a current access unit (AU) comprising the current block.

FIG. 11 shows a flowchart for an example method 1100 of video processing. The method 1100 includes, at operation 1110, performing a conversion between a video and a bitstream of the video, the bitstream conforming to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process comprises replacing parameter sets with replacement parameter sets prior to removing, from an output bitstream, the SEI NAL units.

The following solutions show example embodiments of techniques discussed in the previous section (e.g., items 1-4).

A listing of solutions preferred by some embodiments is provided next.

A1. A method of processing video data, comprising performing a conversion between a video and a bitstream of the video comprising multiple layers, wherein the bitstream comprises a plurality of supplemental enhancement information, SEI, messages associated with an access unit, AU, or a decoding unit, DU, of a particular output layer set, OLS, or a particular layer, wherein the plurality of SEI messages, comprising a message type different from scalable nesting type, is based on a format rule, and wherein the format rule specifies that each of the plurality of SEI messages has a same SEI payload content due to the plurality of SEI messages being associated with the AU or the DU of the particular OLS or the particular layer.

A2. The method of solution A1, wherein the value of the payload type of the scalable nesting SEI message is equal to 133.

A3. The method of solution A1, wherein the plurality of SEI messages comprises at least one SEI message included in a scalable nesting SEI message and at least one SEI message not included in a scalable nesting SEI message.

A4. A method of processing video data, comprising performing a conversion between a video comprising a current block and a bitstream of the video, wherein the bitstream conforms to a format rule, and wherein the format rule specifies a constraint on the bitstream due to a syntax field being excluded from the bitstream, the syntax field being indicative of a picture order count (POC) associated with a current picture comprising the current block or a current access unit (AU) comprising the current block.

A5. The method of solution A4, wherein the syntax field indicative of the POC associated with the current picture and the current AU is excluded, and wherein the constraint specifies that there is no picture belonging to a reference layer of a current layer in the current AU.

A6. The method of solution A4 or A5, wherein the constraint specifies that a previous picture in a decoding order is not a random access skipped leading (RASL) picture or a random access decodable leading (RADL) picture.

A7. The method of solution A4, wherein the constraint specifies that a previous picture in a decoding order is not a random access skipped leading (RASL) picture or a random access decodable leading (RADL) picture due to the current AU excluding a picture belonging to a reference layer of a current layer in the current AU.

A8. The method of solution A6 or A7, wherein a temporal identifier of the previous picture is equal to zero, and wherein the temporal identifier is TemporalId.

A9. The method of any of solutions A4 to A8, wherein the syntax field is ph_poc_msb_cycle_val.

A10. The method of any of solutions A1 to A9, wherein the conversion comprises decoding the video from the bitstream.

A11. The method of any of solutions A1 to A9, wherein the conversion comprises encoding the video into the bitstream.

A12. A method of storing a bitstream representing a video to a computer-readable recording medium, comprising generating the bitstream from the video according to a method described in any one or more of solutions A1 to A9, and storing the bitstream in the computer-readable recording medium.

A13. A video processing apparatus comprising a processor configured to implement a method recited in any one or more of solutions A1 to A12.

A14. A computer-readable medium having instructions stored thereon, the instructions, when executed, causing a processor to implement a method recited in one or more of solutions A1 to A12.

A15. A computer readable medium that stores the bitstream generated according to any one or more of solutions A1 to A12.

A16. A video processing apparatus for storing a bitstream, wherein the video processing apparatus is configured to implement a method recited in any one or more of solutions A1 to A12.

Another listing of solutions preferred by some embodiments is provided next.

B1. A method of processing video data, comprising performing a conversion between a video and a bitstream of the video, wherein the bitstream conforms to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process comprises replacing parameter sets with replacement parameter sets prior to removing, from an output bitstream, the SEI NAL units.

B2. The method of solution B1, wherein the condition specifies that at least one of the SEI NAL units comprises a scalable nesting SEI message comprising (a) a flag that is equal to zero and (b) a first identifier with a value that is different from a value of a second identifier in a list.

B3. The method of solution B2, wherein the flag indicates whether a scalable-nesting SEI message applies to a specific output layer set, wherein the first identifier is a nesting layer identifier, and wherein the second identifier is a layer identifier of a layer in an output layer set.

B4. The method of solution B3, wherein the flag is sn_ols_flag.

B5. The method of solution B3, wherein the first identifier is NestingLayerId and the second identifier is LayerIdInOls[targetOlsIdx].

B6. The method of solution B1, wherein at least one of the SEI NAL units includes a scalable nesting SEI message.

B7. The method of solution B6, wherein the SEI NAL units are removed from the output bitstream due to at least one video coding layer (VCL) NAL unit being removed from the output bitstream.

B8. The method of solution B6 or B7, wherein the scalable nesting SEI message comprises a flag that is equal to zero.

B9. The method of solution B8, wherein the flag is sn_subpic_flag.

B10. The method of any of solutions B1 to B9, wherein the conversion comprises decoding the video from the bitstream.

B11. The method of any of solutions B1 to B9, wherein the conversion comprises encoding the video into the bitstream.

B12. A method of storing a bitstream representing a video to a computer-readable recording medium, comprising generating the bitstream from the video according to a method described in any one or more of solutions B1 to B9, and storing the bitstream in the computer-readable recording medium.

B13. A video processing apparatus comprising a processor configured to implement a method recited in any one or more of solutions B1 to B12.

B14. A computer-readable medium having instructions stored thereon, the instructions, when executed, causing a processor to implement a method recited in one or more of solutions B1 to B12.

B15. A computer readable medium that stores the bitstream generated according to any one or more of solutions B1 to B12.

B16. A video processing apparatus for storing a bitstream, wherein the video processing apparatus is configured to implement a method recited in any one or more of solutions B1 to B12.

Yet another listing of solutions preferred by some embodiments is provided next.

P1. A method of video processing, comprising performing a conversion between a video comprising one or more layers comprising one or more pictures and a coded representation of the video, wherein the coded representation conforms to a format rule, wherein the format rule specifies a constraint on the coded representation in case that there is no syntax field indicative of a picture order count associated with a current picture in a current access unit.

P2. The method of solution P1, wherein the format rule specifies the constraint that a previous picture in a decoding order is not a random access skipped leading or a random access decodable leading picture.

P3. The method of solution P1, wherein the format rule specifies that the constraint is based on the condition that there is no picture belonging to a reference layer of the current layer in a the current access unit.

P4. A method of video processing, comprising performing a conversion between a video comprising one or more layers comprising one or more pictures and a coded representation of the video, wherein the coded representation conforms to an order of a sub-bitstream extraction process that is defined by a rule.

P5. The method of solution P4, wherein the rule specifies that the sub-bitstream extraction process omits a step of removing a scalable nesting supplemental enhancement information (SEI) message from an output bitstream for all SEI network abstraction layer units according to a condition.

P6. The method of solution P4, wherein the rule specifies that the order of the sub-bitstream extraction process includes, replacing parameter sets with replacement parameter sets prior to removing supplemental enhancement information (SEI) network abstraction layer (NAL) units that contain a scalable nesting SEI message in an output bitstream.

P7. A method of video processing, comprising performing a conversion between a video comprising one or more layers comprising one or more pictures and a coded representation of the video, wherein the coded representation conforms to a format rule, wherein the format rule specifies that in case that there are multiple supplemental enhancement information (SEI) messages with a particular value of payload type not equal to 133 that are associated with a particular access unit or decoding unit and apply to a particular output layer set or a layer, the multiple SEI messages have the same SEI payload content.

P8. The method of solution P7, wherein some or all of the multiple SEI messages are scalable nested.

P9. The method of any of solutions P1 to P8, wherein the conversion comprises generating a coded representation from the video.

P10. The method of any of solutions P1 to P8, wherein the conversion comprises decoding the coded representation to generate the video.

P11. A video decoding apparatus comprising a processor configured to implement a method recited in one or more of solutions P1 to P10.

P12. A video encoding apparatus comprising a processor configured to implement a method recited in one or more of solutions P1 to P10.

P13. A computer program product having computer code stored thereon, the code, when executed by a processor, causes the processor to implement a method recited in any of solutions P1 to P10.

P14. A computer readable medium that stores a coded representation generated according to any of solutions P1 to P10.

In the solutions described herein, an encoder may conform to the format rule by producing a coded representation according to the format rule. In the solutions described herein, a decoder may use the format rule to parse syntax elements in the coded representation with the knowledge of presence and absence of syntax elements according to the format rule to produce decoded video.

In the present document, the term "video processing" may refer to video encoding, video decoding, video compression or video decompression. For example, video compression algorithms may be applied during conversion from pixel representation of a video to a corresponding bitstream representation or vice versa. The bitstream representation of a current video block may, for example, correspond to bits that are either co-located or spread in different places within the bitstream, as is defined by the syntax. For example, a macroblock may be encoded in terms of transformed and coded error residual values and also using bits in headers and other fields in the bitstream. Furthermore, during conversion, a decoder may parse a bitstream with the knowledge that some fields may be present, or absent, based on the determination, as is described in the above solutions. Similarly, an encoder may determine that certain syntax fields are or are not to be included and generate the coded representation accordingly by including or excluding the syntax fields from the coded representation.

The disclosed and other solutions, examples, embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an field programmable gate array (FPGA) or an application specific integrated circuit (ASIC).

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., erasable programmable read-only memory (EPROM), electrically erasable programmable read-only memory (EEPROM), and flash memory devices; magnetic disks, e.g., internal hard disks or removable disks; magneto optical disks; and compact disc, read-only memory (CD ROM) and digital versatile disc read-only memory (DVD-ROM) disks. The processor and the memory can be supplemented by, or incorporated in, special purpose logic circuitry.

While this patent document contains many specifics, these should not be construed as limitations on the scope of any subject matter or of what may be claimed, but rather as descriptions of features that may be specific to particular embodiments of particular techniques. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method of processing video data comprising:
 performing a conversion between a video and a bitstream of the video,
 wherein the bitstream conforms to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process comprises replacing parameter sets with replacement parameter sets prior to removing the SEI NAL units from the output bitstream.

2. The method of claim 1, wherein the condition specifies that the SEI NAL unit comprises a scalable nesting SEI message comprising (a) a flag that is equal to zero and (b) there is no value in a first list of a first identifier equal to a value in a second list of a second identifier.

3. The method of claim 2, wherein the flag indicates whether a scalable-nested SEI message applies to a specific output layer set, wherein the first identifier is a nesting layer identifier, and wherein the second identifier is a layer identifier of a layer in an output layer set.

4. The method of claim 3, wherein the flag is a sn_ols_flag.

5. The method of claim 3, wherein the first identifier is a NestingLayerId and the second identifier is a LayerIdInOls[targetOlsIdx].

6. The method of claim 1, wherein at least one of the SEI NAL units includes a scalable nesting SEI message.

7. The method of claim 6, wherein the SEI NAL units are removed from the output bitstream due to at least one video coding layer (VCL) NAL unit being removed from the output bitstream.

8. The method of claim 6, wherein the scalable nesting SEI message comprises a flag that is equal to zero.

9. The method of claim 8, wherein the flag is a sn_subpic_flag.

10. The method of claim 1, wherein the conversion comprises decoding the video from the bitstream.

11. The method of claim 1, wherein the conversion comprises encoding the video into the bitstream.

12. An apparatus for processing video data comprising a processor and a non-transitory memory with instructions thereon, wherein the instructions upon execution by the processor, cause the processor to:
perform a conversion between a video and a bitstream of the video,
wherein the bitstream conforms to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process comprises replacing parameter sets with replacement parameter sets prior to removing the SEI NAL units from the output bitstream.

13. The apparatus of claim 12, wherein the condition specifies that the SEI NAL unit comprises a scalable nesting SEI message comprising (a) a flag that is equal to zero and (b) there is no value in a first list of a first identifier equal to a value in a second list of a second identifier,
wherein the flag indicates whether a scalable-nested SEI message applies to a specific output layer set, wherein the first identifier is a nesting layer identifier, and wherein the second identifier is a layer identifier of a layer in an output layer set, and
wherein the flag is a sn_ols_flag, and wherein the first identifier is a NestingLayerId and the second identifier is a LayerIdInOls[targetOlsIdx].

14. The apparatus of claim 12, wherein at least one of the SEI NAL units includes a scalable nesting SEI message,
wherein the SEI NAL units are removed from the output bitstream due to at least one video coding layer (VCL) NAL unit being removed from the output bitstream,
wherein the scalable nesting SEI message comprises a flag that is equal to zero and the flag is a sn_subpic_flag.

15. A non-transitory computer-readable storage medium storing instructions that cause a processor to:
perform a conversion between a video and a bitstream of the video,
wherein the bitstream conforms to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process comprises replacing parameter sets with replacement parameter sets prior to removing the SEI NAL units from the output bitstream.

16. The non-transitory computer-readable storage medium of claim 15, wherein the condition specifies that the SEI NAL unit comprises a scalable nesting SEI message comprising (a) a flag that is equal to zero and (b) there is no value in a first list of a first identifier equal to a value in a second list of a second identifier,
wherein the flag indicates whether a scalable-nested SEI message applies to a specific output layer set, wherein the first identifier is a nesting layer identifier, and wherein the second identifier is a layer identifier of a layer in an output layer set, and
wherein the flag is a sn_ols_flag, and wherein the first identifier is a NestingLayerId and the second identifier is a LayerIdInOls[targetOlsIdx].

17. The non-transitory computer-readable storage medium of claim 15, wherein at least one of the SEI NAL units includes a scalable nesting SEI message,
wherein the SEI NAL units are removed from the output bitstream due to at least one video coding layer (VCL) NAL unit being removed from the output bitstream,
wherein the scalable nesting SEI message comprises a flag that is equal to zero and the flag is a sn_subpic_flag.

18. A method for storing a bitstream of a video, wherein the method comprises:
generating the bitstream of the video; and
storing the bitstream of the video in a non-transitory computer-readable recording medium,
wherein the bitstream conforms to an order of a sub-bitstream extraction process that is defined by a rule that specifies (a) the sub-bitstream extraction process excludes an operation that removes all supplemental enhancement information (SEI) network abstraction layer (NAL) units, which satisfy a condition, from an output bitstream or (b) the order of the sub-bitstream extraction process comprises replacing parameter sets with replacement parameter sets prior to removing the SEI NAL units from the output bitstream.

19. The method of claim 18, wherein the condition specifies that the SEI NAL unit comprises a scalable nesting SEI message comprising (a) a flag that is equal to zero and (b) there is no value in a first list of a first identifier equal to a value in a second list of a second identifier,
wherein the flag indicates whether a scalable-nested SEI message applies to a specific output layer set, wherein the first identifier is a nesting layer identifier, and wherein the second identifier is a layer identifier of a layer in an output layer set, and wherein the flag is a sn_ols_flag, and wherein the first identifier is a NestingLayerId and the second identifier is a LayerIdInOls[targetOlsIdx].

20. The method of claim 18, wherein at least one of the SEI NAL units includes a scalable nesting SEI message, wherein the SEI NAL units are removed from the output bitstream due to at least one video coding layer (VCL) NAL unit being removed from the output bitstream, wherein the scalable nesting SEI message comprises a flag that is equal to zero and the flag is a sn_subpic_flag.

* * * * *